United States Patent [19]

Matsunaga et al.

[11] Patent Number: 5,461,574
[45] Date of Patent: Oct. 24, 1995

[54] METHOD OF EXPRESSING A LOGIC CIRCUIT

[75] Inventors: Yusuke Matsunaga, Yokohama; Masahiro Fujita, Kawasaki, both of Japan

[73] Assignee: Fujitsu Limited, Kanagawa, Japan

[21] Appl. No.: 373,451

[22] Filed: Jan. 17, 1995

Related U.S. Application Data

[63] Continuation of Ser. No. 287,583, Aug. 5, 1994, abandoned, which is a continuation of Ser. No. 71,338, Jun. 2, 1993, abandoned, which is a continuation of Ser. No. 602,233, Nov. 8, 1990, abandoned.

[30] Foreign Application Priority Data

Mar. 9, 1989 [JP] Japan .................. 1-056906

[51] Int. Cl.$^6$ .................................................. G06F 17/50
[52] U.S. Cl. ............................................ 364/489; 364/488
[58] Field of Search .............................. 364/488, 489, 364/490, 491

[56] References Cited

U.S. PATENT DOCUMENTS

| | | | |
|---|---|---|---|
| 4,703,435 | 10/1987 | Darringer et al. | 364/489 |
| 4,792,909 | 12/1988 | Serlet | 364/491 |
| 4,916,627 | 4/1990 | Hathaway | 364/490 |

OTHER PUBLICATIONS

Fujita et al., "Evaluation and Improvements of Boolean Comparison Method Based on Binary Decision Diagrams", IEEE International Conference on Computer–Aided Design, Santa Clara, California, Nov. 7–10, 1988, pp. 2–5.
Bryant, "Graph–Based Algorithms for Boolean Function Manipulation", IEEE transactions on Computers, vol. C35, No. 8, Aug. 1986, pp. 677–691.
Barlett et al., "Multi–level Logic Minimization Using Implicit Don't Cares", Proceedings IEEE International Conference on Computers Design: VLSI in Computers, New York, Oct. 6–9, 1986, pp. 552–557.
IEEE International Conference on Computer–Aided Design ICCAD–89 Digest of Technical Papers, Multi–Level Logic Optimization Using Binary Decision Diagrams, Nov. 5–9, 1989.
Matsunaga et al., "Multi–level Logic Optimization Using Binary Decision Diagrams", IEEE International Conference on Computer–Aided Design, Santa Clara, California, Nov. 5–9, 1989, pp. 556–559.
"Binary Decision Diagrams" by S. B. Akers, IEEE Trans. on Computers, vol. C–27, No. 6, Jun. 1978, pp. 509–516.
"A Rule–Based System for Optimizing Combinational Logic" by de Gues et al., IEEE Design & Test, Aug. 1985, pp. 22–32.

*Primary Examiner*—Vincent N. Trans
*Attorney, Agent, or Firm*—Staas & Halsey

[57] ABSTRACT

A method of expressing a logic circuit for use in a multistage logic circuit optimizing process for performing removal or scale-down modification of redundant circuit parts without changing an output logic. A tree-structure binary decision diagram representing a permissible function or a logic function is created for determining the order of input variables of a multistage logic circuit, allocating an input variable of the first order to the root, allocating the other input variables to nodes, branching the root for each logic state (1, 0) that the input variable can assume, linking branches with nodes to which an input variable of the next order is allocated and linking branches with leaves providing logic (1, 0, don't care) or logic (1, 0) of each gate and net of the circuit. Two binary decision diagrams representing permissible functions intersect to terminate branches of input variables linked with the don't-care leaf to a 0 or 1 leaf, thereby merging gates. Two binary decision diagrams of the same type are traced from their respective roots in the direction of the same logic of each input variable. When respective leaves are reached, operational processing is performed on logic states of the leaves for each combination of logic states of the input variables.

8 Claims, 36 Drawing Sheets

$f = ab + b\bar{c} + \bar{a}\bar{c} \longrightarrow f = ab + \bar{a}\bar{c}$

Fig. 3 (a)

$f = abc + ab\bar{d} + \bar{a}\bar{c}\bar{d} + \bar{b}\bar{c}\bar{d} \longrightarrow \begin{array}{l} f = xy + \bar{x}\bar{y} \\ x = ab \\ y = c + d \end{array}$

Fig. 3 (b)

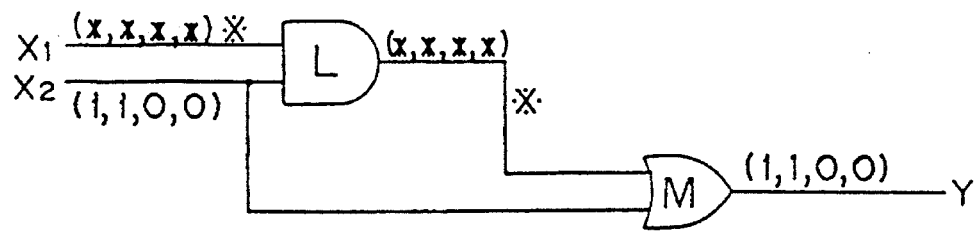
Fig. 6(f)
X2 ─────────────
Fig. 6(g)
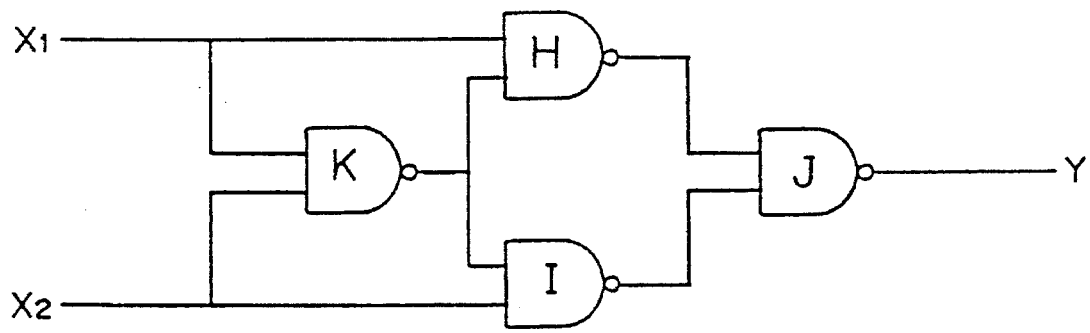
Fig. 6(e)

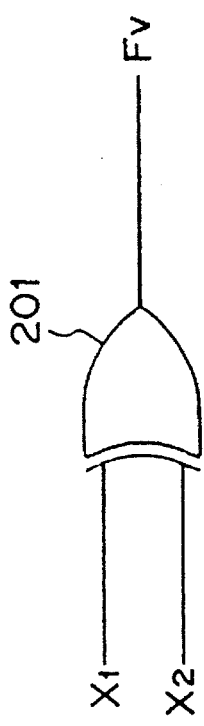
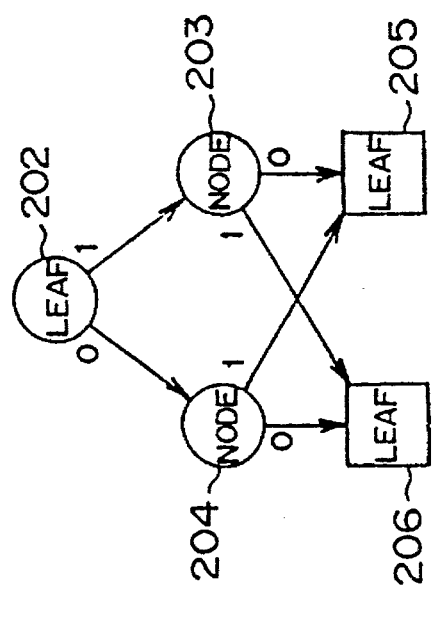
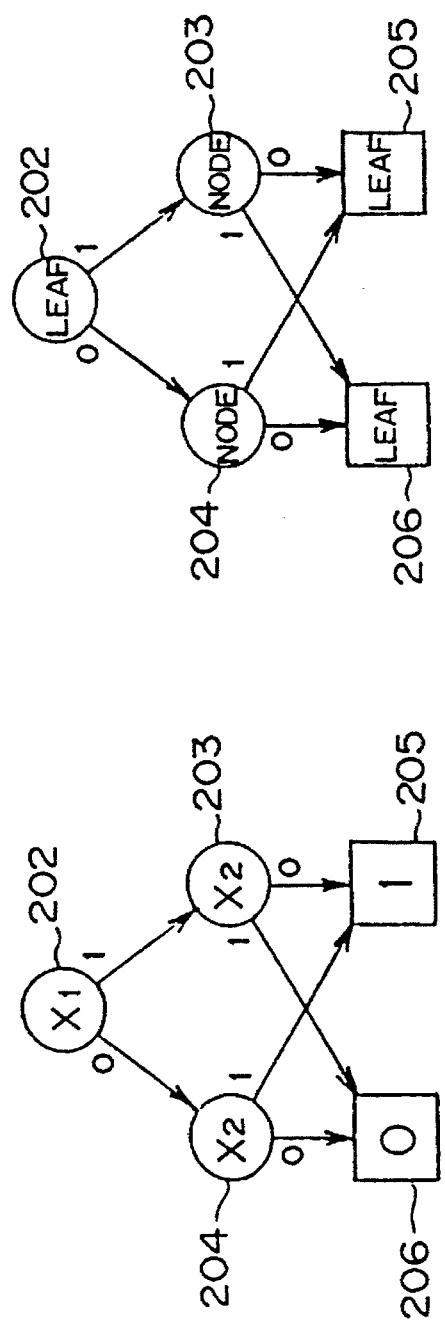
Fig. 7(c)
Fig. 7(d)
Fig. 7(e)

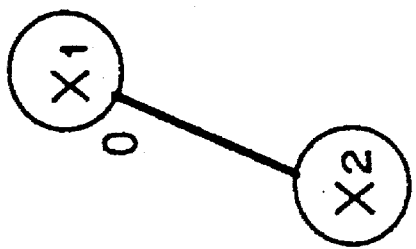
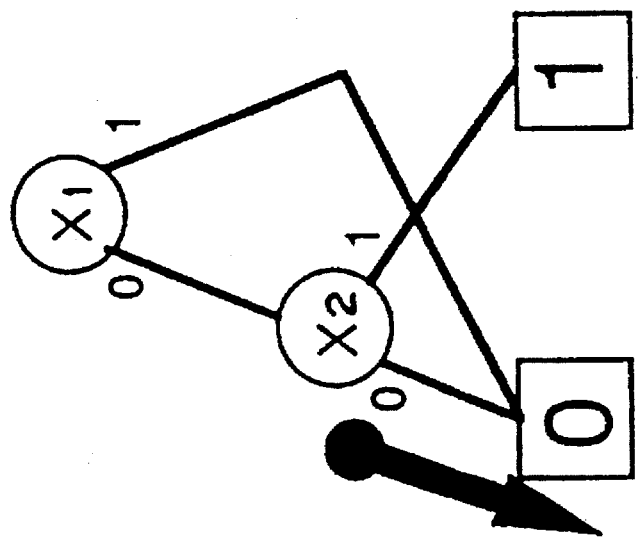
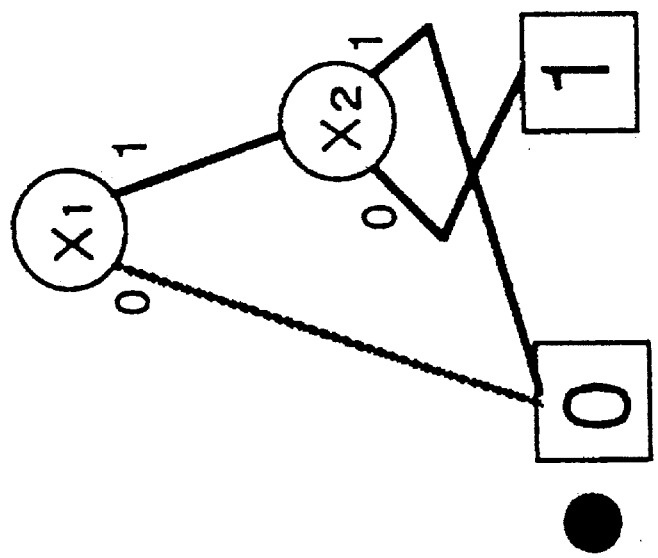
Fig. 15(b)

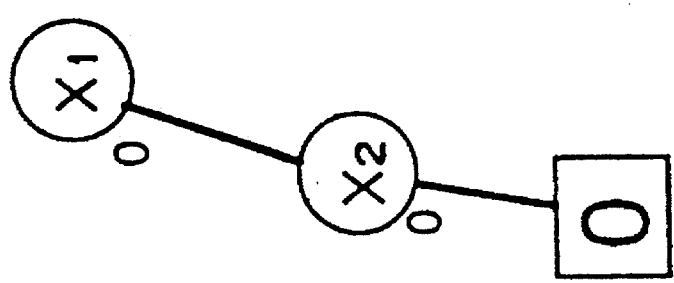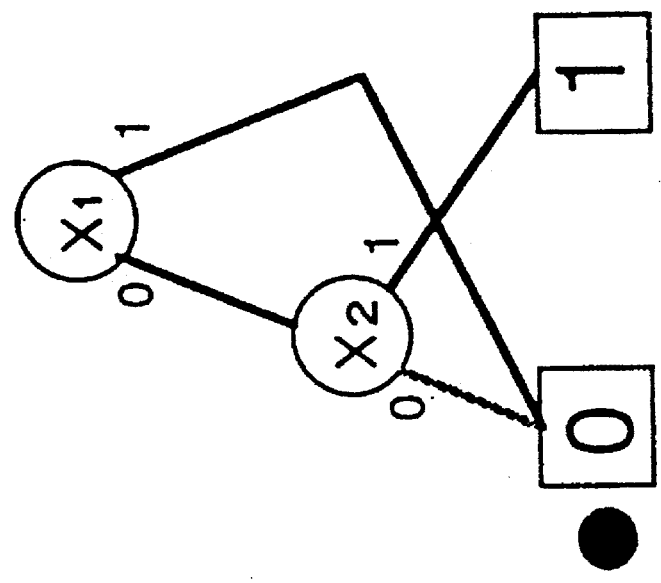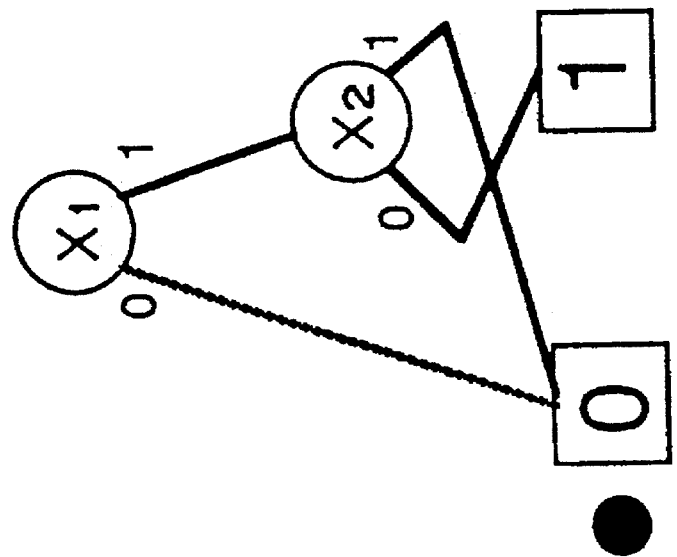
Fig. 15(c)

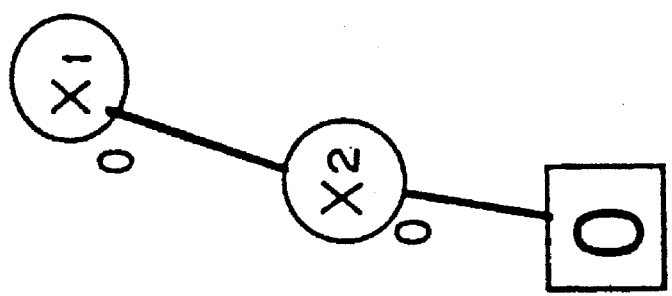
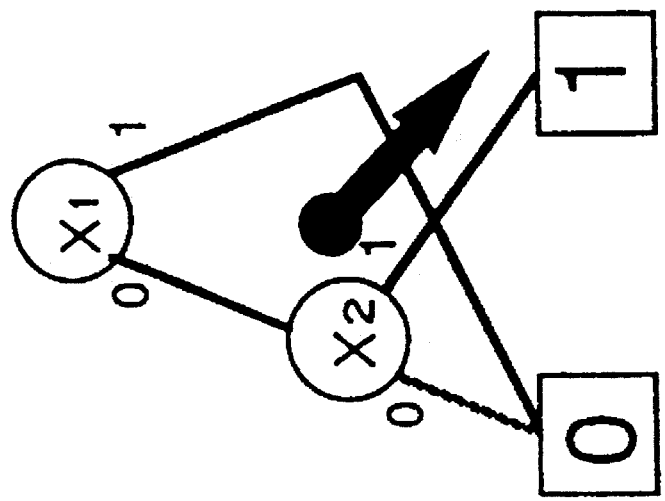
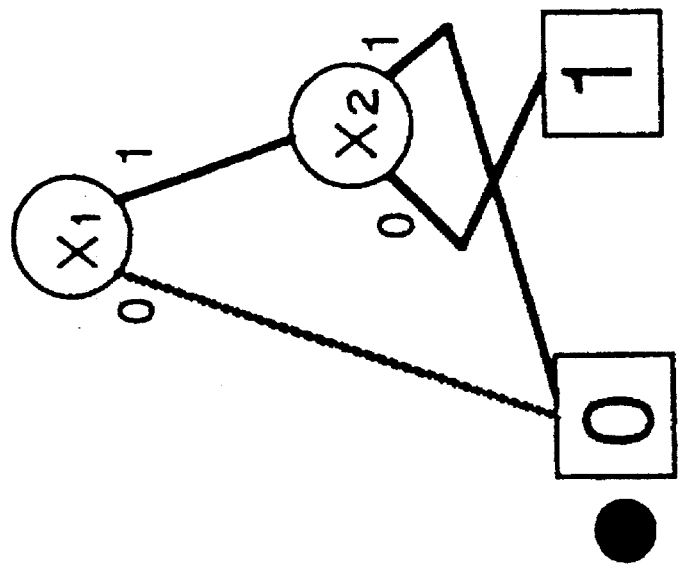
Fig. 15 (d)

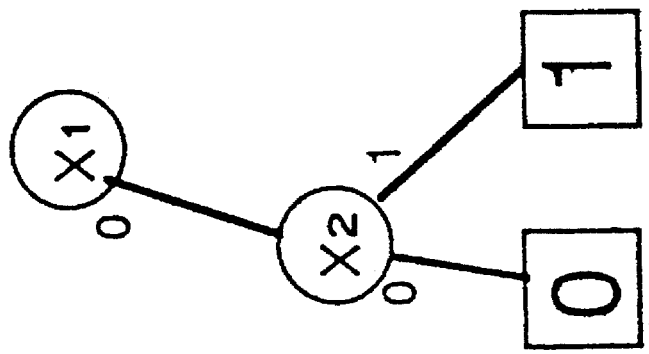
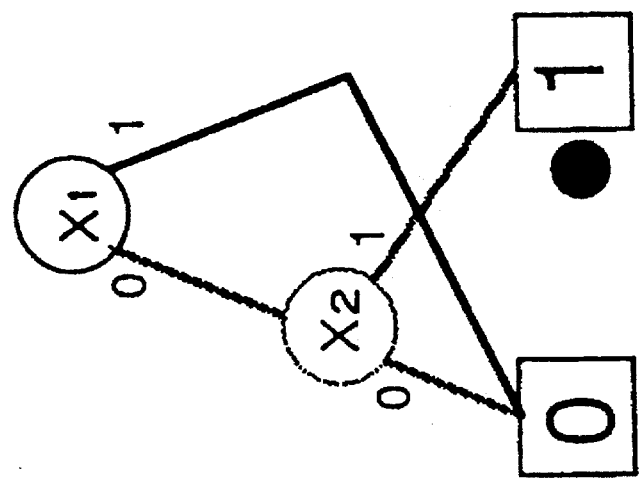
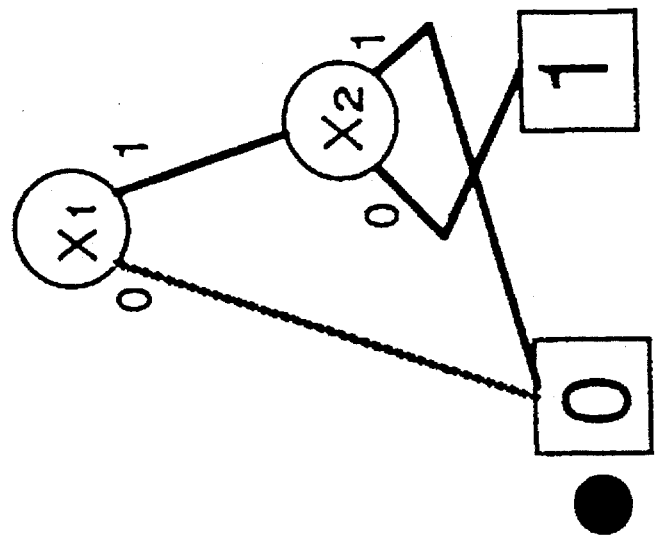
Fig. 15 (e)

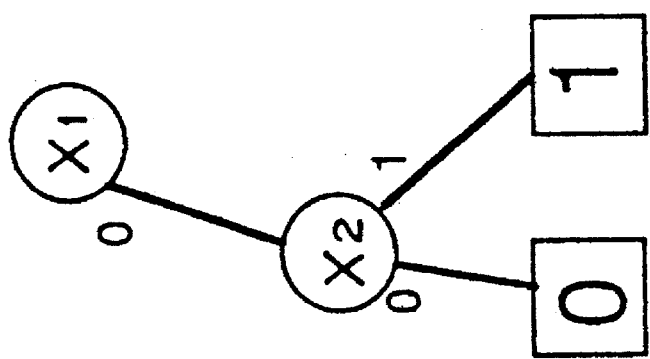
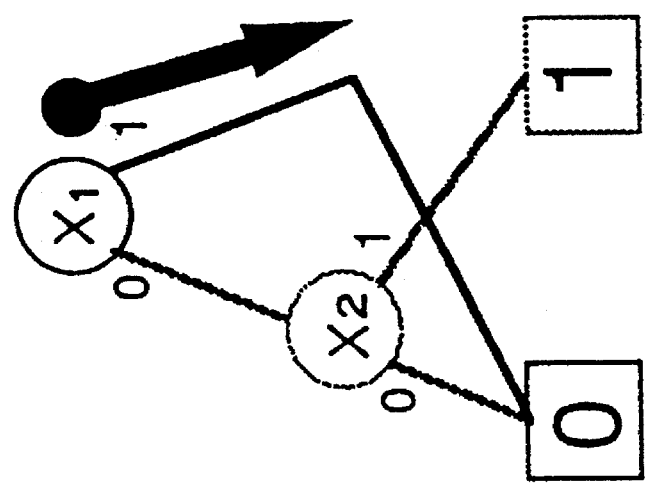
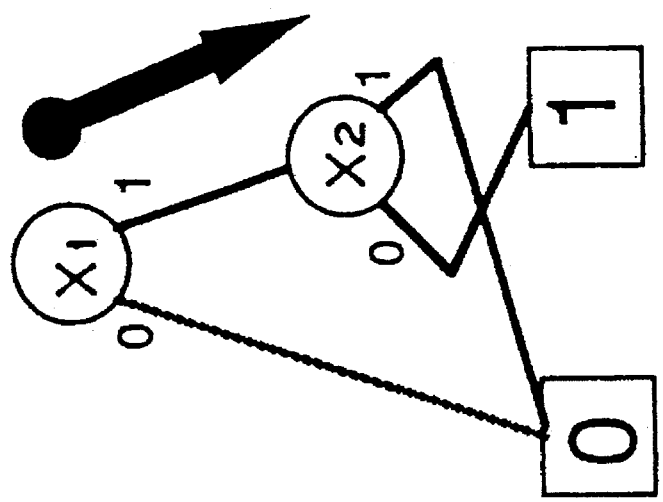
Fig. 15(f)

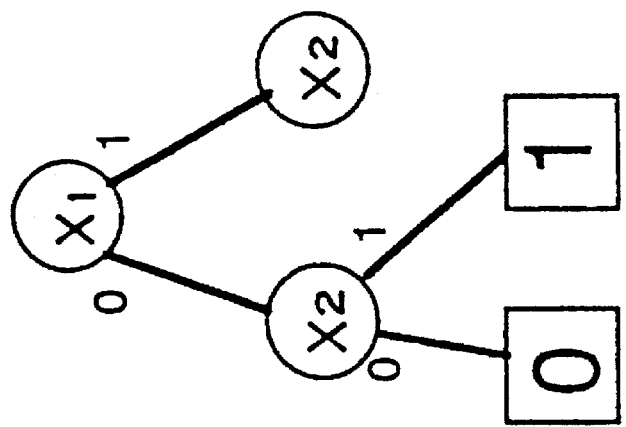
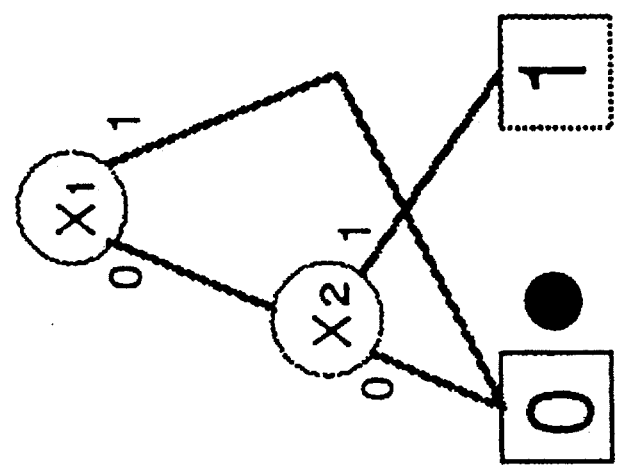
Fig. 15(g)
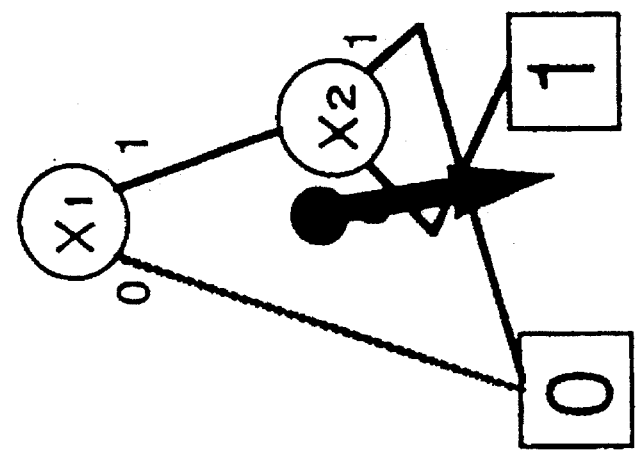

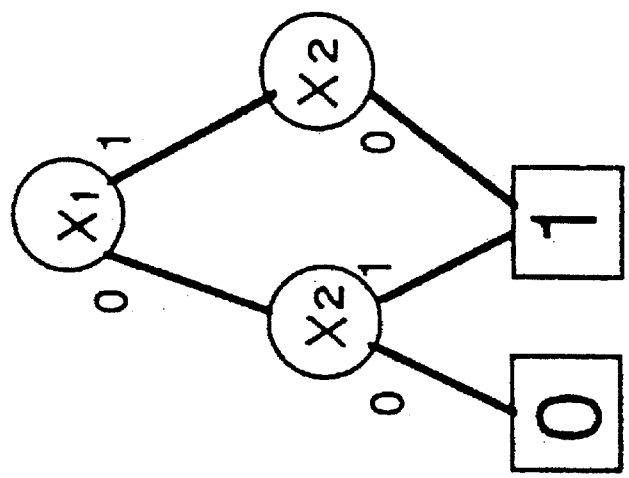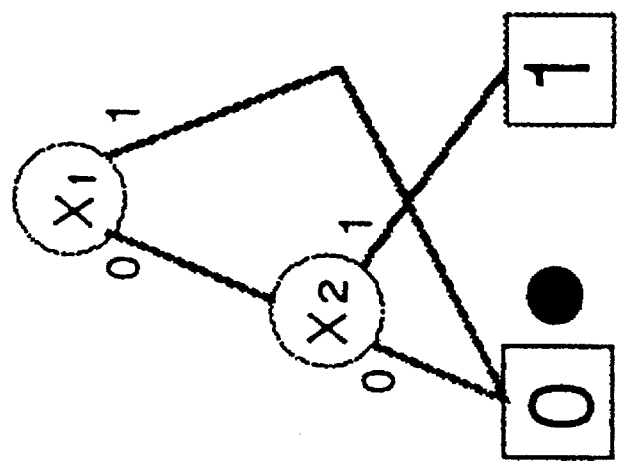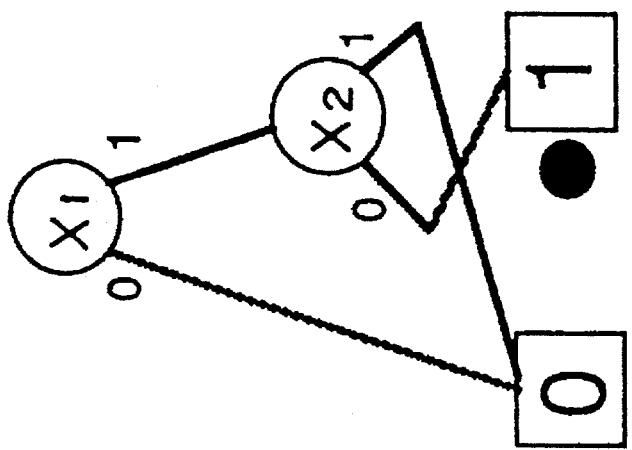
Fig. 15(h)

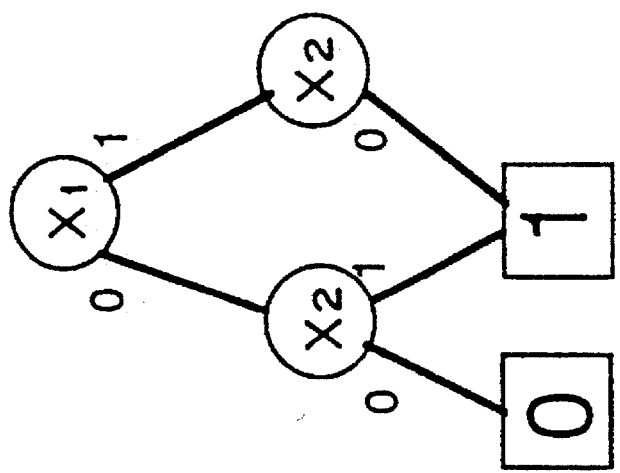
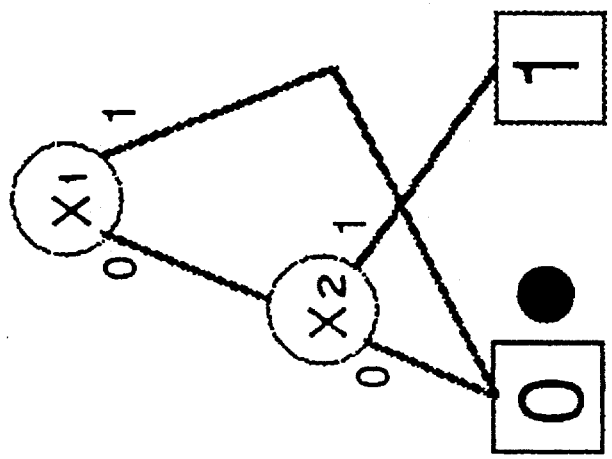
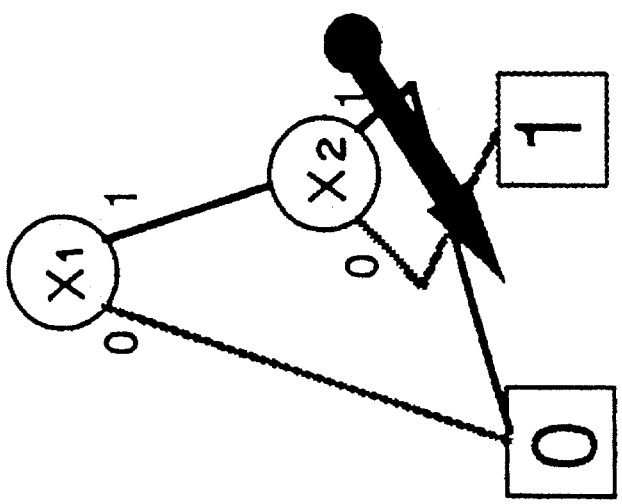
Fig. 15(i)

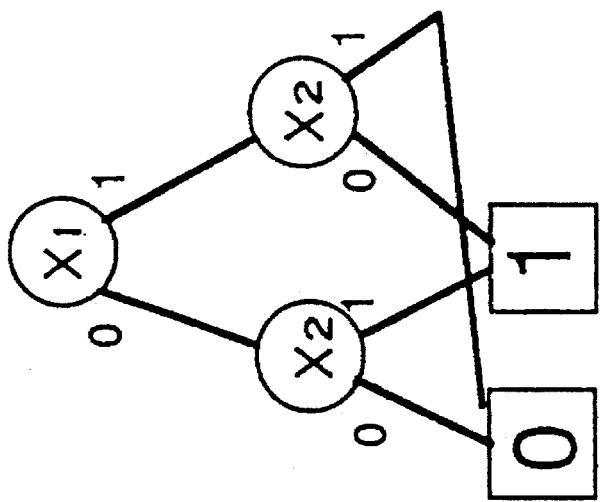
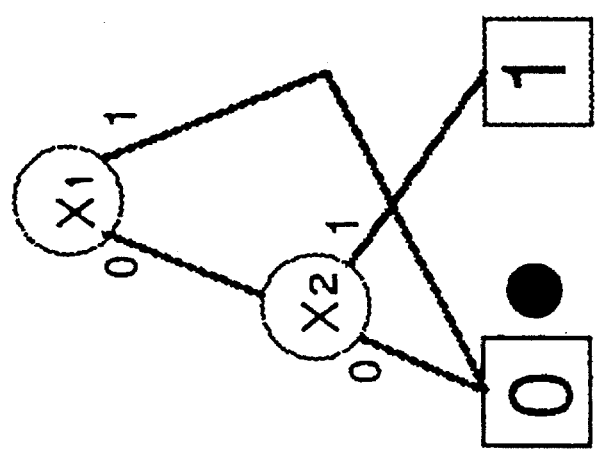
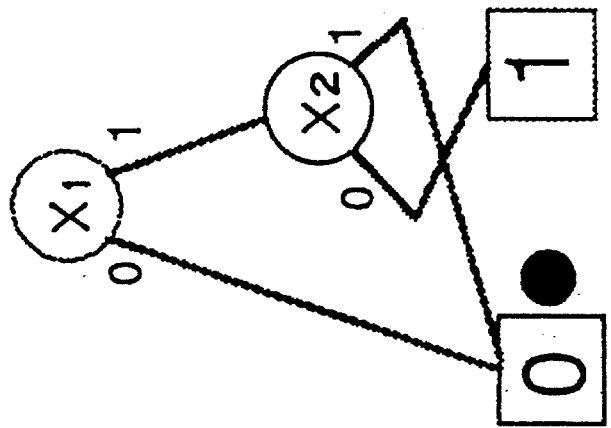
Fig. 15(j)

```
gate_merging()
{
    foreach gate g1 {
        foreach gate g2(≠g1) {
            stat = try_merge(g1,g2);
            if (stat == TRUE && merit > 0) {
                change_circuit();
                recalculate_logic();
                recalculate_CSPF();
            }
        }
    }
}

Bool try_merge(g1, g2)
{
    pf = PF(g1) ∩ PF(g2);
    /* PF means Permissible Function */
    if (pf == NULL) {
        return FALSE;
    }
    /* now try to make new gate
       whose logic is contained by pf */
    foreach gate g in candidates {
        try to connect g to new gate;
    }
    try to delete fanins from new gate;
    if (pf contains new gate's logic) {
        return TRUE;
    }
    return FALSE;
}
```

Fig. 16

```
apply(v1, v2, op)
{
    clear T[];
    v = apply_step(v1, v2, op);
    return v;
} apply_step(v1, v2, op)
{
    val = v1->val op v2->val;
    if (val is terminal node's value) {
        return newVertex2(val);
    }
    new = T[v1->id, v2->id];
    if (new ≠ NULL) {
        return new;
    }
    index = min(v1->index, v2->index);
    if (index == v1->index) {
        v1_low = v1->low;
        v1_high = v1->high;
    } else {
        v1_low = v1_high = v1;
    }
    if (index == v2->index) {
        v2_low = v2->low;
        v2_high = v2->high;
    } else {
        v2_low = v2_high = v2;
    }
    low = apply_step(v1_low, v2_low, op);
    high = apply_step(v1_high, v2_high, op);
    new = newVertex(low, high, index);
    T[v1->id, v2->id] = new;
    return new;
} newVertex(low, high, index)
{
    if (v exists such that
        v->low == low && v->high == high
     && v->index == index) {
        return v;
    }
    make new node v;
    v->low = low;
    v->high = high;
    v->index = index;
    return v;
} newVertex2(val)
{
    if (v exists such that v->val == val) {
        return v;
    }
    make new node v;
    v->val = val;
    return v;
}
```

Fig. 17

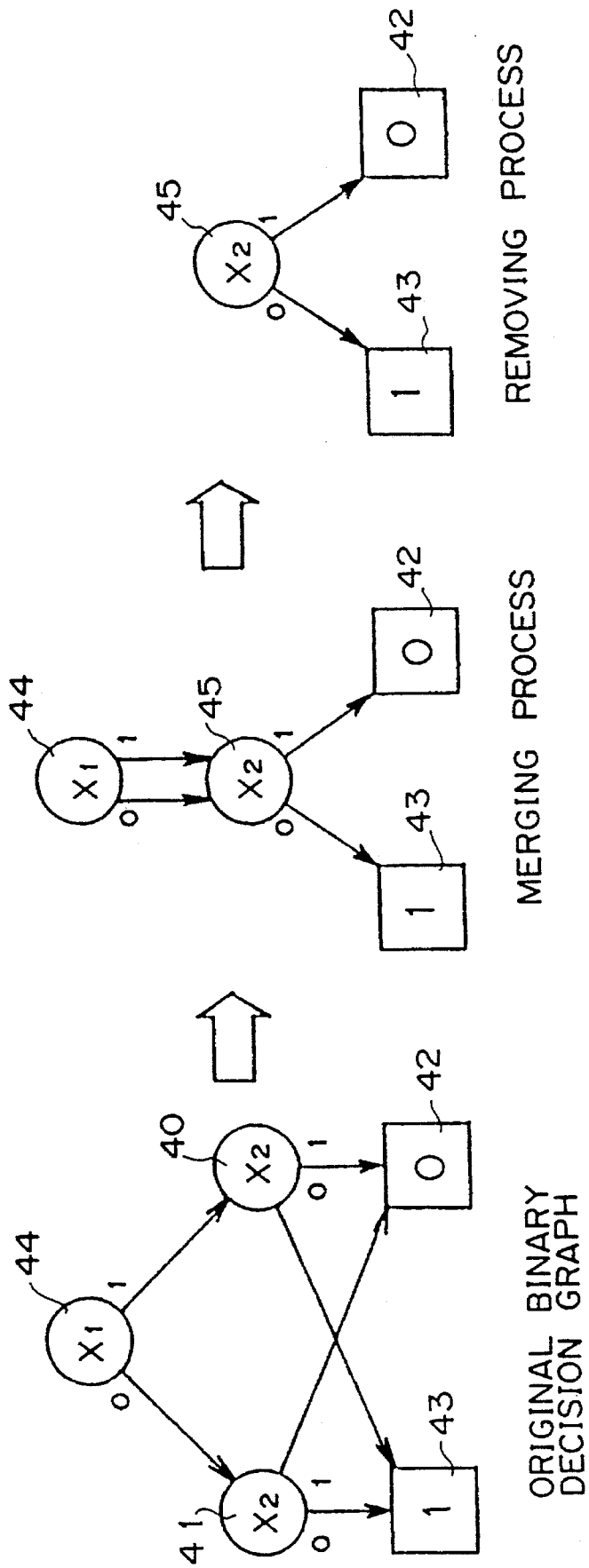
Fig. 19(a) ORIGINAL BINARY DECISION GRAPH
Fig. 19(b) MERGING PROCESS
Fig. 19(c) REMOVING PROCESS

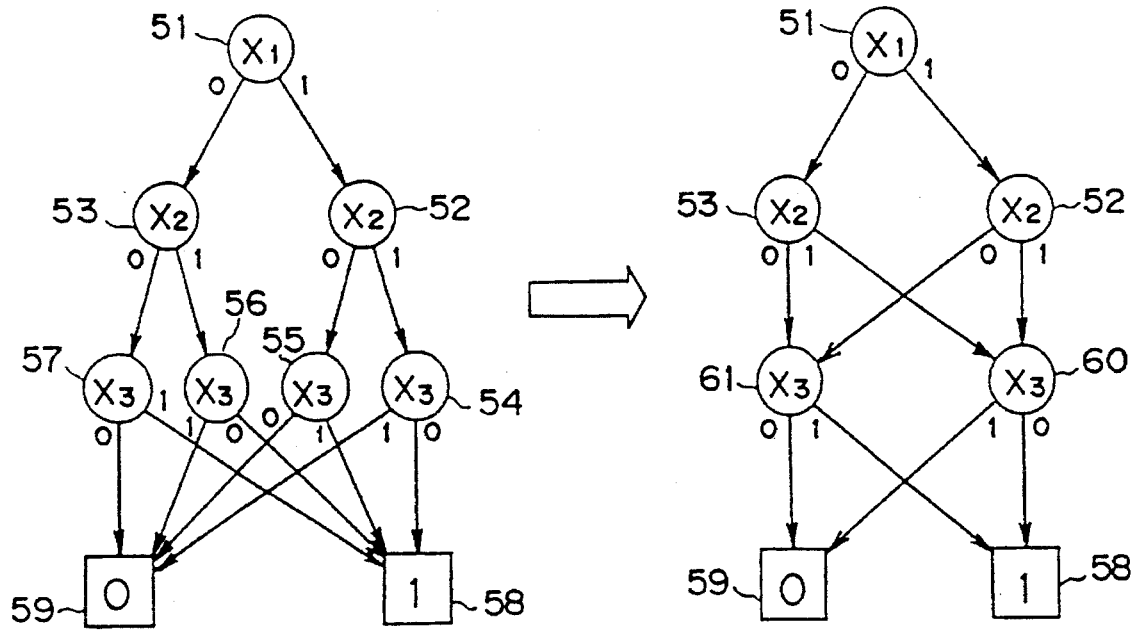
Fig. 20(c)
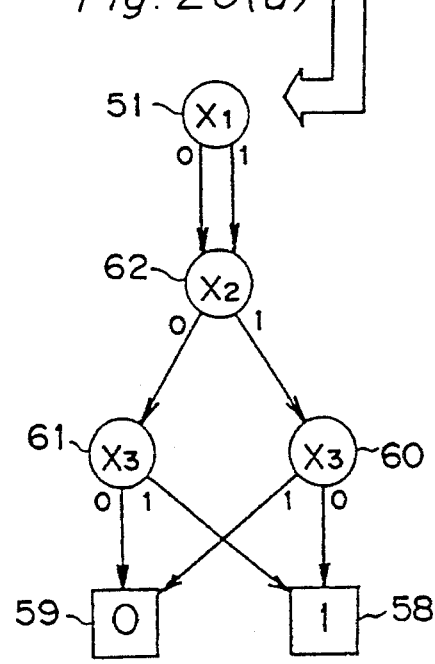
Fig. 20(d)
Fig. 20(e)
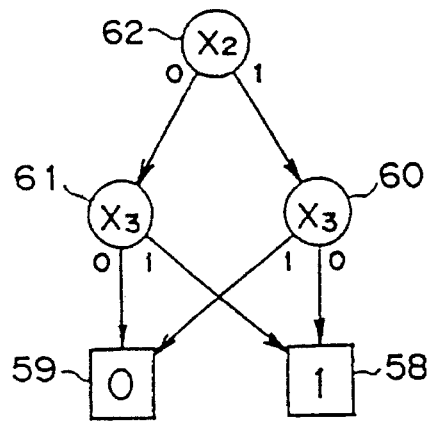
Fig. 20(f)

⊕ DESIGNATES EXCLUSIVE – OR (a$\bar{b}$ + $\bar{a}$b)

METHOD OF EXPRESSING A LOGIC CIRCUIT

This is a continuation of application Ser. No. 08/287,583, filed Aug. 5, 1994, now abandoned, which is a continuation of application Ser. No. 08/071,338, filed Jun. 2, 1993, abandoned, which is a continuation of application Ser. No. 07/602,233, filed Nov. 8, 1990, abandoned

FIELD OF THE INVENTION

The present invention relates to a method of expressing a logic circuit for use with a logic-circuit optimizing process for converting a multistage logic circuit comprised of a plurality of logic gates to a smaller scale logic circuit without changing its output logic.

BACKGROUND OF THE INVENTION

The general flow of a logic synthesizing process is illustrated in FIG. 1. The inputs may be applied in the form of a truth table representing a logical function of an object circuit, a logical expression in a two-stage sum-of-products form or a logical expression in a multistage network form (as shown in FIG. 2, each portion in the network that corresponds to one logical expression is called a node) in which truth tables or logical expressions for respective stages are combined. The final output is provided in the form of a net list of gate cells depending on a gate-array or standard-cell technology.

FIG. 2 illustrates an example of the multistage network of logical expressions in FIG. 1. More specifically, FIG. 2 illustrates a multistage logic circuit with inputs $x_1$, $x_2$ and outputs $y_1$, $y_2$. Each of three nodes 1, 2 and 3 corresponds to one logical expression.

Various internal processing systems have been proposed for a logic Synthesizing process such as that shown in FIG. 1. In general, the system is divided into a portion, such as that shown in FIG. 2, adapted to create a multistage network of technology-independent logical expressions and a portion adapted to convert the network to actual circuits. Hereinafter, the technology-independent process will be mainly described.

In the technology-independent process, a given logical expression is converted to a simpler logical expression (the term "simple" means that the number of factors used in a logical expression is small.). A common part is factored out from the logical expression, thereby creating a desired multistage logic network (which is called a logic synthesis or a logic optimizing process).

FIGS. 3(a) and 3(b) illustrate examples of the logic optimizing process. More specifically, FIG. 3(a) illustrates an example of a simplification in which $f = ab + b\bar{c} + a\bar{c}$ is simplified such that $$f = abc + ab\bar{c} + a\bar{b}c + \bar{a}b\bar{c} + \bar{a}\bar{b}c + \bar{a}\bar{b}\bar{c}$$
$$= abc + a\bar{b}c + \bar{a}b\bar{c} + \bar{a}\bar{b}c$$
$$= ab + \bar{a}c$$

In the case of FIG. 3(b), ab and c+d, which appear repeatedly, are replaced with new variables x and y, respectively, and common parts are factored out.

Such processes are all performed by changing the expressions on a symbolic manipulation basis. Since those expressions are Boolean algebraic expressions, the simplification and factoring should be defined in accordance with Boolean algebra. However, changing expressions based on Boolean algebra is very costly (with respect to calculation time and memories used), and the processes as shown in FIG. 3 also cause a lot of trouble in calculation in proportion to the exponents of the input variables in the worst case. For high-speed processes, therefore, these expressions may be regarded as normal algebraic expressions. Of course, normal algebraic expressions and Boolean algebraic expressions have no identical property. For instance, a+a=a and aa=a in Boolean algebra, while, according to normal algebraic expressions, a+a=2a $a^2$. Thus, when f=ad+bcd+e and g =a+b, f can be expressed as f=gd(a+c)+e in the Boolean algebra. But, f cannot be expressed by use of g in normal algebra. Also, since a certain variable and its negation cannot be recognized, conversion utilizing the theorem of $a+\bar{a}=1$ cannot be performed. Having such drawbacks, a circuit automatically synthesized by use of only processes based on normal algebra is inferior, in circuit scale, to a circuit resulting from automatic synthesis using the rules of Boolean algebra.

Several methods of performing Boolean algebraic processes have been proposed in order to create high-quality circuits. One of them is a method based on simplification of a two-stage sum-of-products logical expression (hereinafter referred to as method A), according to which the "don't care condition" for each node in a network is utilized for simplification of the node and factoring. There is a case in which a particular combination of node values never occurs in a multistage network and a case where output node values do not affect values at the external output terminal. Thus, the "don't care conditions" for each node are expressed in the form of a sum-of-products logical expression using external inputs and intermediate nodes. Even if the logic function of the node is changed due to some transformation of the expression, when the "don't care conditions" involve the case in which a change occurs, the transformation will not alter the logic function of the entire circuit (a combination of such values cannot occur or the effect of such change does not arrive at the output). Thus, the use of the "don't care conditions" will permit more powerful simplification and factoring.

FIG. 4 illustrates an example of the "don't care conditions" of the method A. In the Figure, since, for example, at node 4, its output j is the inverse signal of an input g, combinations of j= 0, g =0; and j=1, g=0 cannot occur. Thus, $D=\bar{g}\cdot\bar{j}+g\cdot j$ becomes effective as the don't-care condition for all the nodes.

The time required for calculation in the method is proportional to the square of the number of product terms (in the case of a+bc, a and bc are product terms) in a logical expression involving a don't-care condition. Thus, high-speed processing will be made possible if a compact expression using a sum-of-products logical expression is allowed. Since the number of product terms in a sum-of-products logical expression representing don't-care conditions in a normal multistage logic network is very large, a device for reducing the number of product terms representing don't care has been proposed in order to perform a process within a practical period (of course, the capability decreases as compared with the case where a complete don't-care conditions is used).

According to another method, an actual logic function and a don't-care condition of a node are defined as a vector (the so-called a truth table) for a set of values of external inputs (hereinafter referred to as method B).

FIG. 5 illustrates an example of don't-care conditions in method B. In this example, a $V_1$ and $V_2$ are input and $V_5$ is output. For example, $f_5=[0,0,1,1]$ represents that the output $V_5$ changes in the order of 0, 0, 1, 1 when the input $V_1$ changes in the order of 0, 0, 1, 1, while the input $V_2$ changes in the order of 0, 1, 0, 1.

In FIG. 5, the logic of the output $V_5$ (which is herein the same as that of $V_4$) is needed for the logic of the inputs $V_1$ and $V_2$. There is no need for the logic of the node 8. Thus, any logic that gates of the inside of the circuit (the node 8 in this case) can take can be obtained within the range in which the logic of the output $V_5$ remains unchanged. Such logic is called a permissible function. That is, for the node 9, since $V_3=1$ is possible when $V_1=1$ and $V_2=0$, and $V_3=0$ is also possible when $V_1 = V_2 = 1$, $f_3=[0, 0, 1, 0]$ can be written. Thus, the permissible function for the logic of the output $V_3$ of the node 8 can be written as (0, 0, *, *) * stands for don't care FIG. 6 illustrates an example of logic functions and permissible functions of circuits and a circuit optimizing process using those functions. More specifically, FIG. 6(a) illustrates the output logic of each of gates C, D and E when an input $X_1$ is changed in the order of 0, 0, 1, 1 and an input $X_2$ is changed in the order of 0, 1, 0, 1. FIG. 6(b) illustrates permissible functions of the gates A, B, C and D and inputs $X_1$ and $X_2$ which keep the output of the circuit (gate E) in the order of 0, 1, 1, 0.

FIG. 6(c) illustrates a logic circuit implemented with EX-OR circuits and FIG. 6D illustrates permissible functions for the EX-OR circuits. In FIG. 6(e), since the permissible functions of gates F and G in FIG. 6(d) are common (0, 1, 1, *), gates F and G are merged into a gate F which implements the common part in their permissible functions.

Furthermore, FIGS. 6(f) and 6(g) illustrate a redundant-net removing process. A gate L with permissible function (*, *, *, *)

and nets in FIG. 6(f) can be removed for conversion to a circuit with no redundancy, as shown in FIG. 6(g).

In method B, no use is made of intermediate nodes so that, unlike the method A, there is no "combination of values that can never take place." However, a multistage expression of a logical expression containing intermediate nodes represents the topology of a circuit, while a truth table merely represents a logic function implemented by each node. Thus, it should be noted that a truth table is not a representation itself of a circuit. Therefore, a process slightly different from that in method A must be performed. Generally, to perform optimization, some transformation of an expression is performed such that a change in the logic function is involved in don't care conditions. (In method B, transformations are not performed indiscriminately to undergo subsequent checks. The kinds of transformations to be performed are determined previously from don't-care conditions. On this point, method B is quite distinct from method A.)

Method B also permits powerful optimization. In this case, however, the amount of memory must always be proportional to the exponent of an input variable. Furthermore, the same amount of trouble is necessary in calculation. Handling of a 10-to-20-input circuit is the limits of the fastest computers of today.

DISCLOSURE OF THE INVENTION

It is an object of the present invention to provide a method of expressing a logic circuit which permits the speeding up of an optimizing process for a multistage logic circuit by performing operations on two binary decision graphs representing, for example, logic functions using a data structure called a sequenced binary decision graph.

As a method of expressing a don't care condition, the present invention takes a form that uses only external inputs, as is the case with the conventional method B. The binary decision diagram used in the invention is a directed graph in which the order in which nodal points appear on a general binary decision tree is fixed and moreover partial trees of the same form are grouped. Binary decision diagrams of the same logic and the same order have the property of becoming the same form in all cases.

FIG. 7 illustrates the principle of the present invention. FIG. 7(a) illustrates an example of the binary decision diagrams of a logic function which represents $f=V_1 \cdot V_2+V_3$. In the binary decision diagram of a logic function, the order of inputs, $V_1$, $V_2$ and $V_3$ in this example, is first decided and then the graph is created in accordance with this order.

The order of the inputs is $V_1$, $V_2$ and $V_3$ in this example. First, the input variable $V_1$ is handled as a root 10. Branches are extended from the root 10 to its right and left sides according to $V_1=1$ and $V_1=0$. When $V_1=1$, the corresponding branch leads to a node 12 having the input variable $V_2$ and branches extend therefrom according to $V_2=1$ and $V_2=0$. When $V_1=0$, on the other hand, the value for $V_2$ is unrelated to the output logic. Thus, the corresponding branch leads to a node 11 representing the input variable $V_3$. The output logic also depends on the input variable $V_3$ when the input variable $V_2=0$. Thus, the branch for $V_2=0$ leads to the node 11 of the input variable $V_3$. Finally, branches for $V_2=1$ and $V_3=1$ lead to a leaf 14 representing output logic 1, and the branch for $V_3=0$ leads to a leaf 13 representing output logic 0.

FIG. 7(b) illustrates an example of a binary decision diagram representing a permissible function containing a don't care condition as well as 0, 1 as output logic. The method of creating the graph representing a permissible function is essentially the same as the method of creating the binary decision diagram representing a logic function of FIG. 7(a). However, leaves representing output logic include a leaf 19 representing don't-care output, in addition to a leaf 17 representing output logic 0 and a leaf 18 representing output 1. This Figure shows that a don't-care output is produced. That is, the output logic can take either of 0 and 1 when $V_1=0$, 1 when $V_1=1$ and $V_2=0$, and 0 when $V_1=V_2=1$.

FIGS. 7(c) through 7(e) illustrate a two-input EX-OR circuit and binary decision diagrams representing the logic function therefor. Using an input $X_1$ to the EX-OR circuit 201 of FIG. 7(c) as the root 202, the other input $X_2$ as nodes 203 and 204 and the output $F_y$ as leaves 205 and 206 yields the binary decision graph of FIG. 7(d). FIG. 7(e) represents the binary decision diagram in terms of root, node and leaf in place of variable and output logic.

FIGS. 8 and 9 are binary decision diagrams representing logic functions and permissible functions corresponding to vector representation of the logic functions and permissible functions of FIG. 6. More specifically, FIG. 8 illustrates binary decision graphs representing logic functions of respective gates. These graphs can be drawn on the basis of vector representation of the logic functions of FIG. 6(a). For example, the vector representation of the output of circuit (gate E) corresponds to the case where the input $X_1$ varies in the order 0, 0, 1, 1 and the input $X_2$ varies in the order 0, 1, 0, 1. The binary decision diagram representing the output logic function of the gate E can be drawn from the vector representation.

The binary decision diagram of a net supplied with input variable $X_1$ can be drawn based on the fact that logic 1 is obtained when $X_1=1$ and logic 0 is obtained when $X_1=0$. Although the logic function of the output of gate (inverter) A is not shown in FIG. 6, it is natural that the binary decision diagram representing the logic function of its output can be drawn as shown because the output of the inverter A results from the inversion signal of input variable $X_2$.

The binary decision diagrams representing permissible functions in FIG. 9 can be drawn from vector representations of permissible functions of FIG. 6(b). The permissible function of the circuit (gate E) contains no don't-care condition. Thus, its binary decision diagram is exactly the same as in FIG. 8. Binary decision diagrams representing permissible functions containing leaves representing don't care are drawn for the other portions as shown in correspondence with FIG. 6(b).

In the present invention, the optimizing process for a multistage logic circuit is performed using such binary decision diagrams representing logic functions or permissible functions as described above.

BRIEF DESCRIPTION OF THE DRAWINGS

FIGS. 3(a) and 3(b) illustrate examples of a logic optimizing process, FIGS. 6(a) through 6(g) illustrate examples of vector representations of logic functions and permissible functions of circuits, FIGS. 15(a) through 15(j) are diagrams illustrating embodiments for performing OR operations on two binary decision diagrams, FIG. 16 illustrates an embodiment of a program for a gate merging process, FIG. 17 illustrates an embodiment of a program for performing operations on two binary decision diagrams, FIGS. 19(a) to 19(c) illustrate an embodiment of a process of transforming a binary decision diagram (part 1), FIGS. 20(a) through 20(f) illustrate the other embodiment of the binary decision diagram transforming process (part 2)

The Best Mode for Practicing the Present Invention

In the present invention, an optimizing process for a multistage logic circuit is performed using binary decision diagrams representing logic functions or permissible functions. The binary decision diagrams are created first. The creation of those binary decision diagrams is described based on the vector representation of FIG. 6 with reference to FIGS. 8 and 9. In general, the binary decision diagrams are created in accordance with the flowcharts illustrated in FIGS. 10 to 12.

Figure 10:
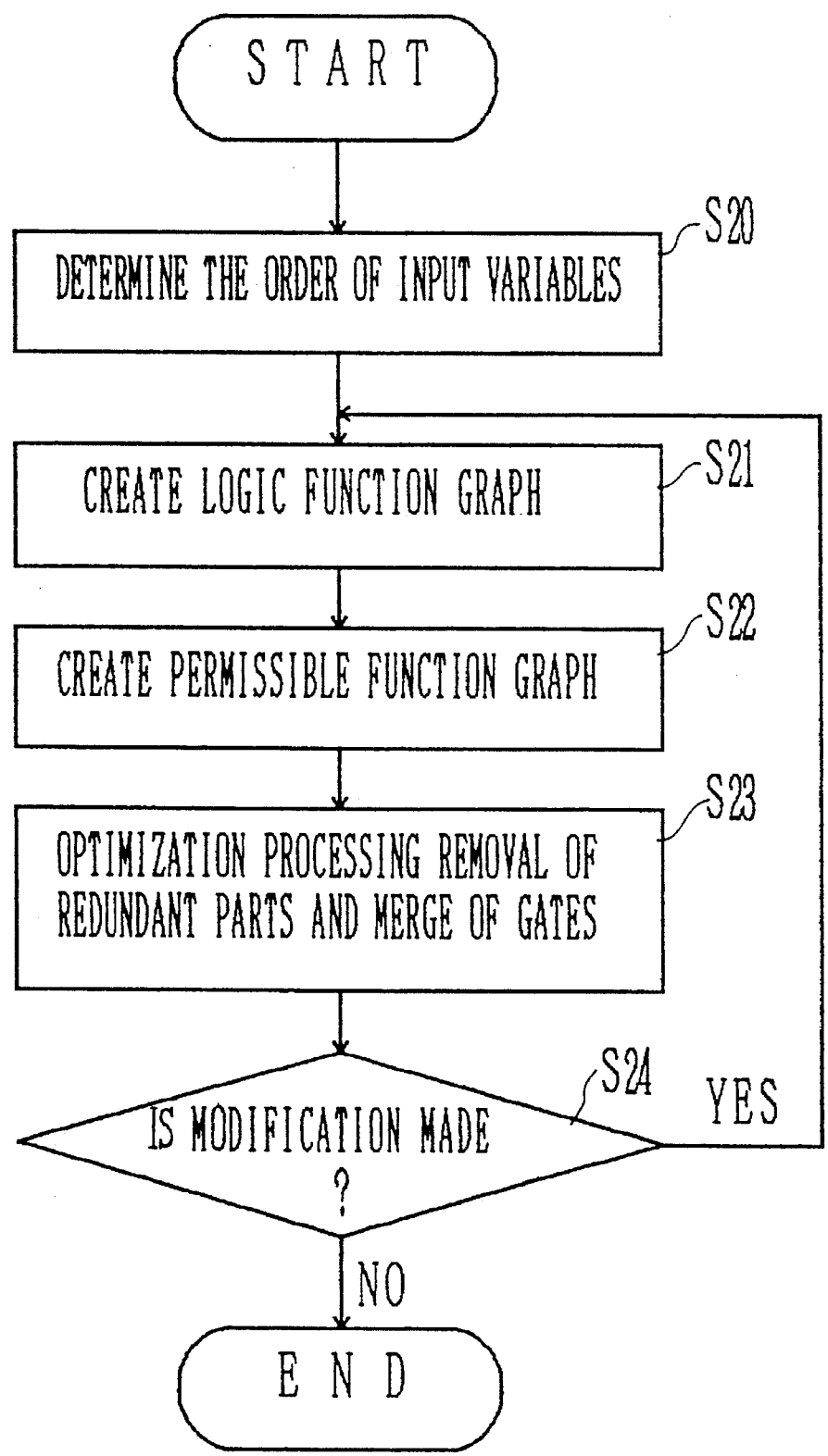
FIG. 10 is a flowchart of an embodiment of an optimizing process for a multistage logic circuit using two binary decision graphs.

FIG. 10 is a flowchart for an embodiment of a multistage logic circuit optimizing process using binary decision diagrams. In this Figure, first, in S (step) 20, the sequence of input variables is determined to create binary decision diagrams. In step S1, binary decision diagrams for logic functions are created and in step S22, binary decision diagrams for permissible functions are created. Next, in step S23, an optimizing process involving removal of redundant parts and merge of gates is performed. In step S24, a determination is made as to whether or not a modification has been made in the logic circuit as a result of the optimizing process. If modification has been made, the modified part is subjected to the process from step $21 again. If no modification has been made, the processing terminates.

Figure 8:
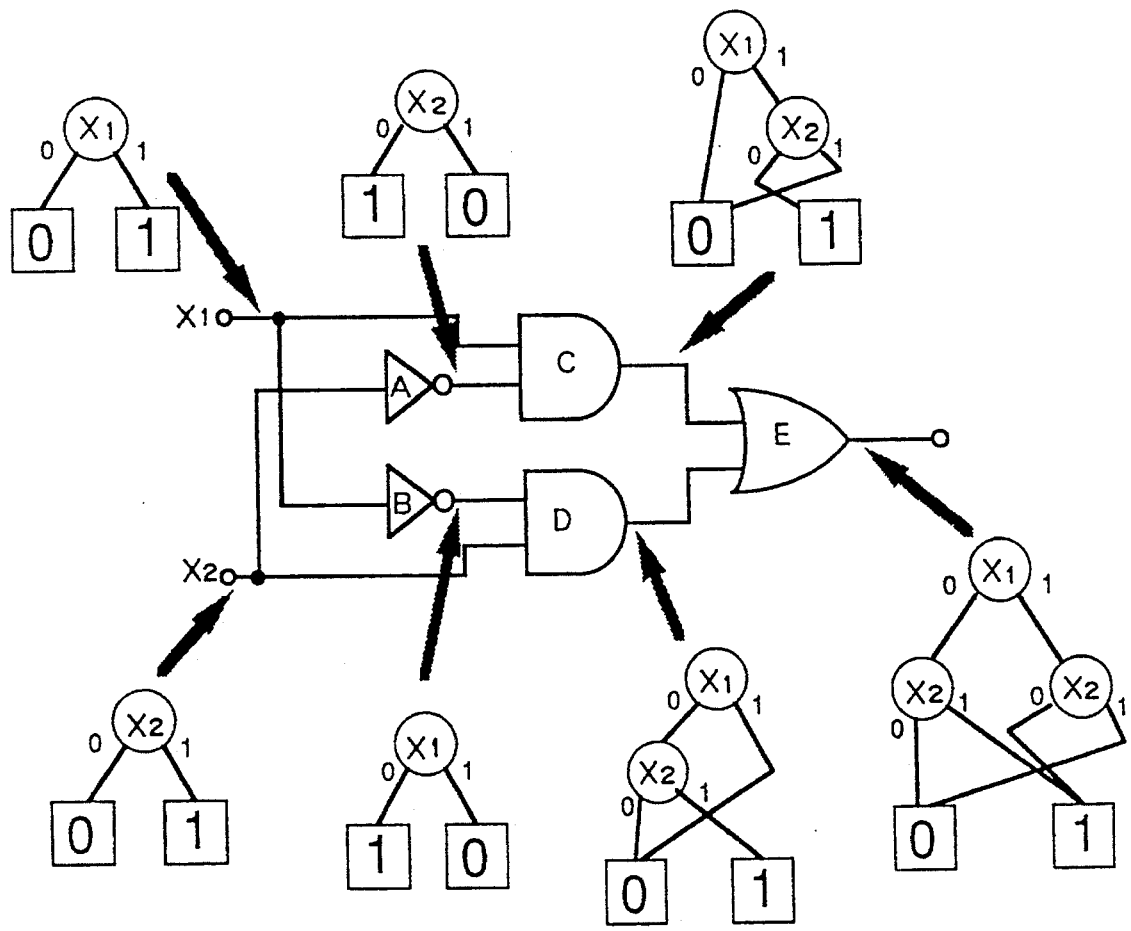
FIG. 8 illustrates examples of binary decision diagrams representing logic functions of circuits.
Figure 11:
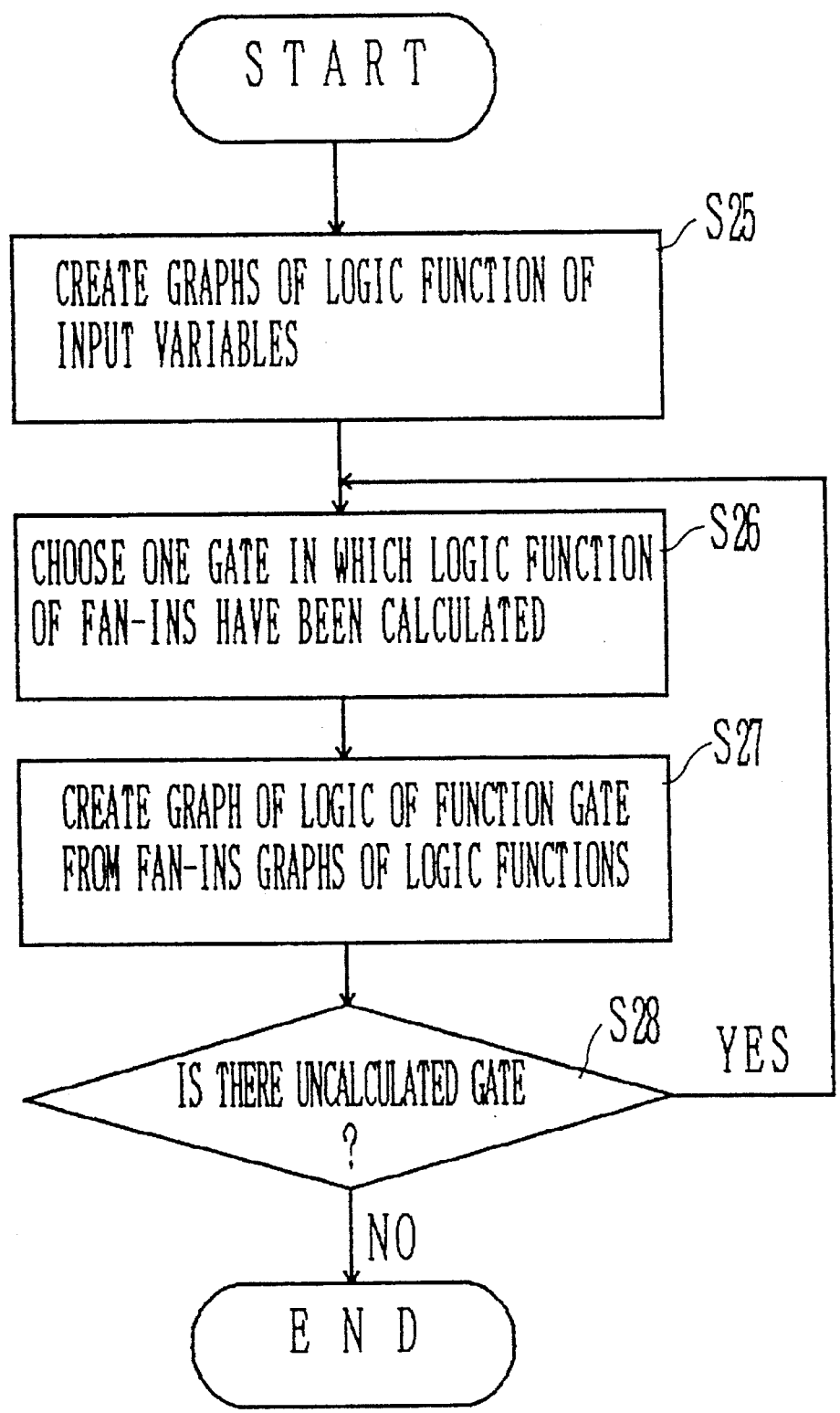
FIG. 11 is a flowchart of an embodiment of a binary decision diagram representing a logic function.

FIG. 11 is a flowchart of the creation process of binary decision diagrams for logic functions in step S21 of FIG. 10. In this Figure, first, in step S25, binary decision diagrams for the input variables are created. For example, this corresponds to creation of a binary decision diagram representing the logic function of the net supplied with the input variable $X_1$ in FIG. 8. In step S26, one gate in which the logic states of its fan-in have all been calculated is chosen. In FIG. 8, this gate corresponds, for example, to gate A. In step S27, the binary decision diagram representing the logic function of the gate is created from binary decision diagrams for the fan-in logic.

Assuming that gate A has been chosen in step S26, the binary decision diagram for output of the gate A is created in step S27. In step S28, a determination is made as to whether or not there is a gate which has not yet been calculated. If there is an uncalculated gate, the processing steps are repeated from step S26. If there is not the uncalculated gate, the process terminates. When the binary decision diagram for the output of gate A is created in step S27, the gate to be chosen next in step S26 is either gate B or gate C, and this gate is processed in step S27.

Figure 12:
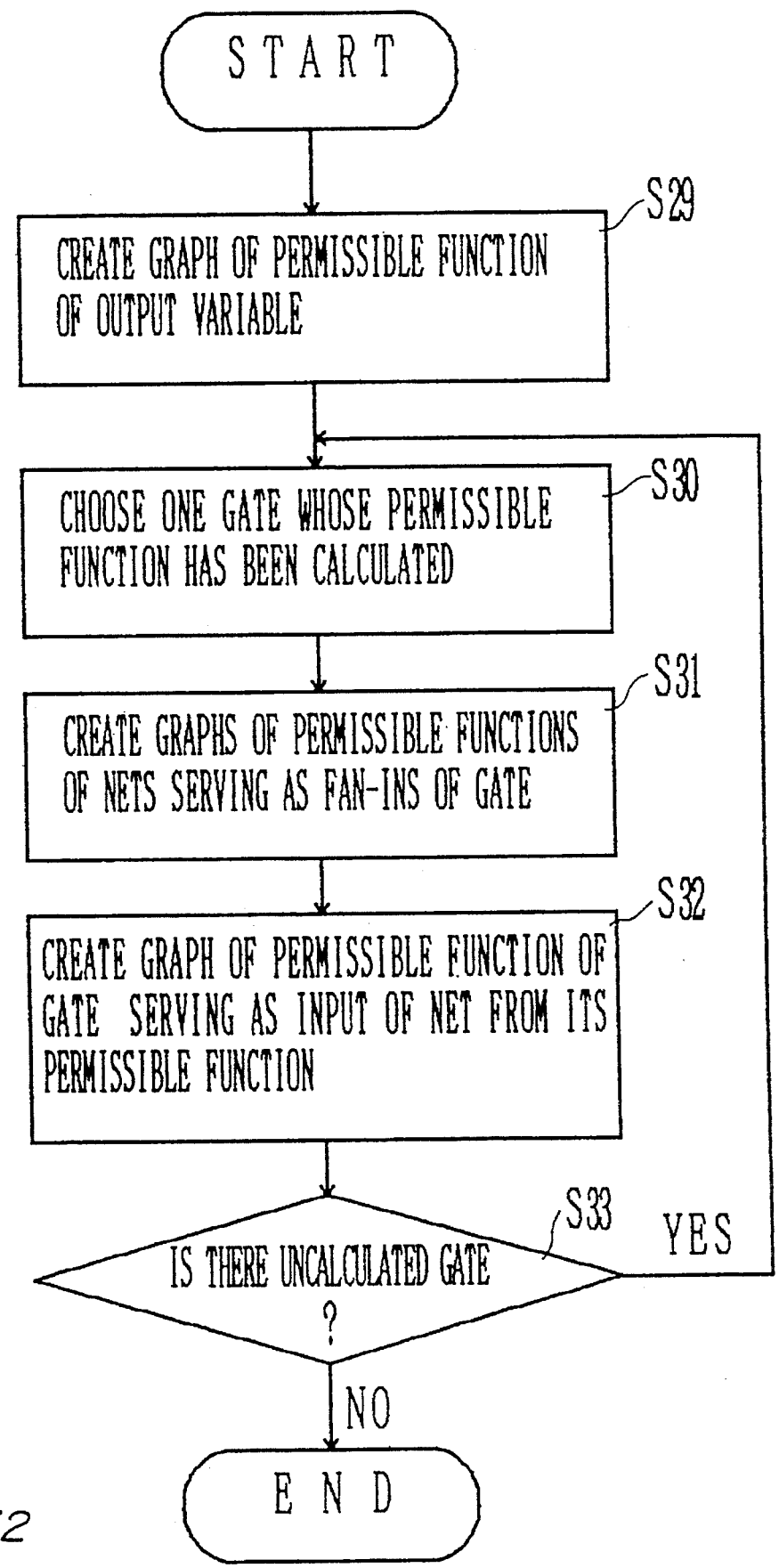
FIG. 12 is a flowchart of an embodiment of a binary decision diagram representing a permissible function.

FIG. 12 is a flowchart of an embodiment of step S22 in FIG. 10, i.e., the process of creating a binary decision diagram representing a permissible function. In this Figure, first, in step S29, a binary decision diagram representing a permissible function of an output variable is created. That is, the creation of binary decision diagrams for permissible functions is performed from the output side of the logic circuit. This is opposite to the case of Figure 11 in which the creation is performed from the input side. Next, in step S30, one gate whose permissible function has been calculated is chosen. This is gate E in FIG. 9. In step S31, binary decision diagrams representing permissible functions for the nets constituting fan-ins of the gate are created. For gate E there are two fan-in nets which come from gates C and D. The binary decision diagrams for those nets are created simultaneously.

In step S32, binary decision diagrams are created representing permissible functions for the gates providing inputs to the nets on the basis of the permissible functions for the calculated nets. The binary decision diagrams for gates C and D are thereby created herein. In step S33, the presence or absence of an uncalculated gate is determined. If an uncalculated gate is present, the above steps are repeated from step S30. If one is not present, the process terminates.

Figure 13:
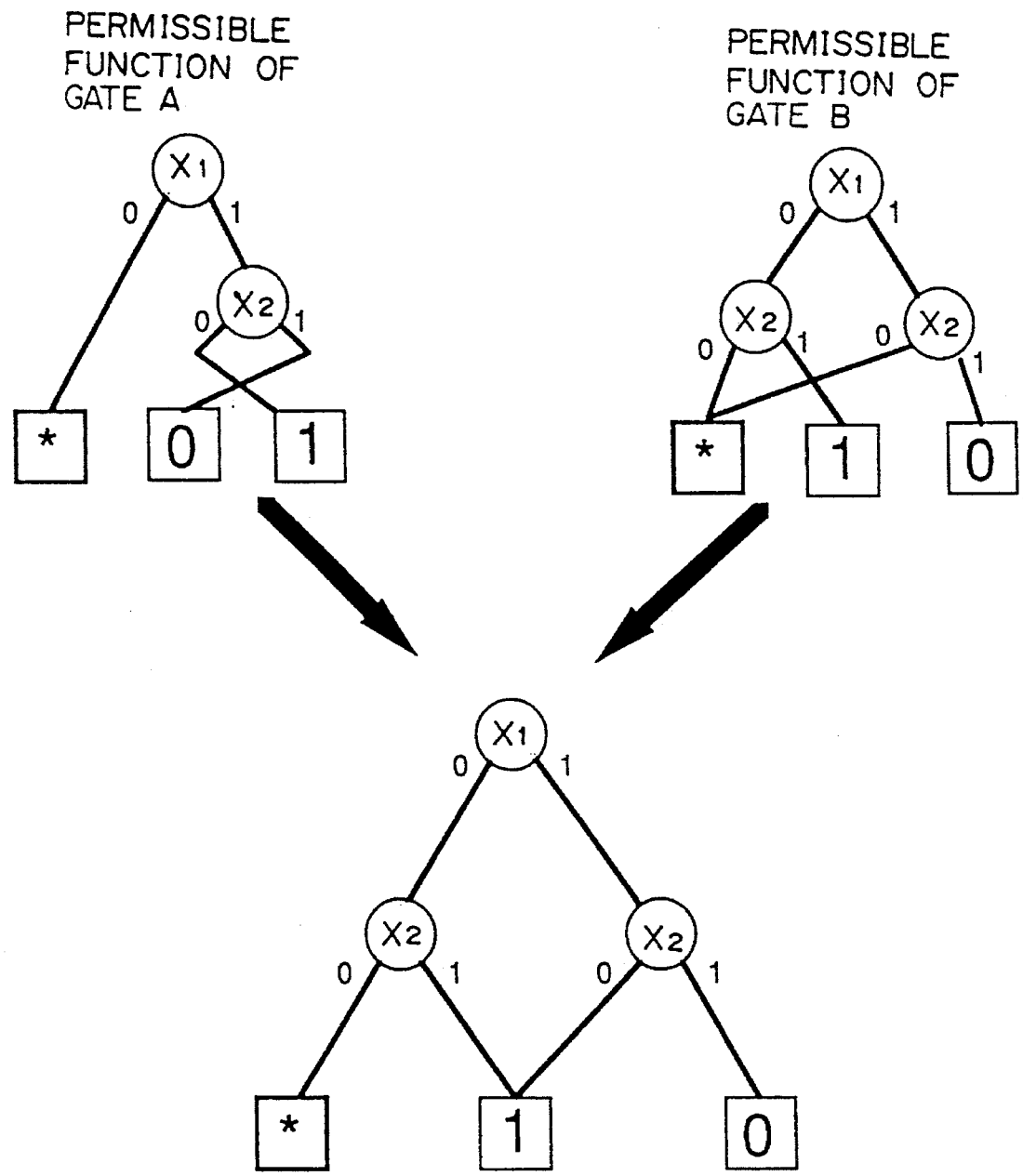
FIG. 13 is a diagram illustrating an embodiment of the intersection of two binary decision graphs.

FIG. 13 illustrates an embodiment of a process of merging two binary decision diagrams, i.e., an intersection. In this Figure, intersection is taken between the binary decision diagrams representing the permissible functions for the outputs of gates A and B of FIG. 9. When $X_1=0$ on the side of gate A, the output logic is don't-care and is independent of the $X_2$ logic. After the intersection this may be changed such that don't-care output logic is obtained when input variable $X_2=0$ and 1 output logic is obtained when $X_2=1$. On the side of gate B, the output logic is don't care when $X_1=1$ and $X_2=0$. It doesn't matter if the output logic is changed to 1 after the intersection.

Figure 9:
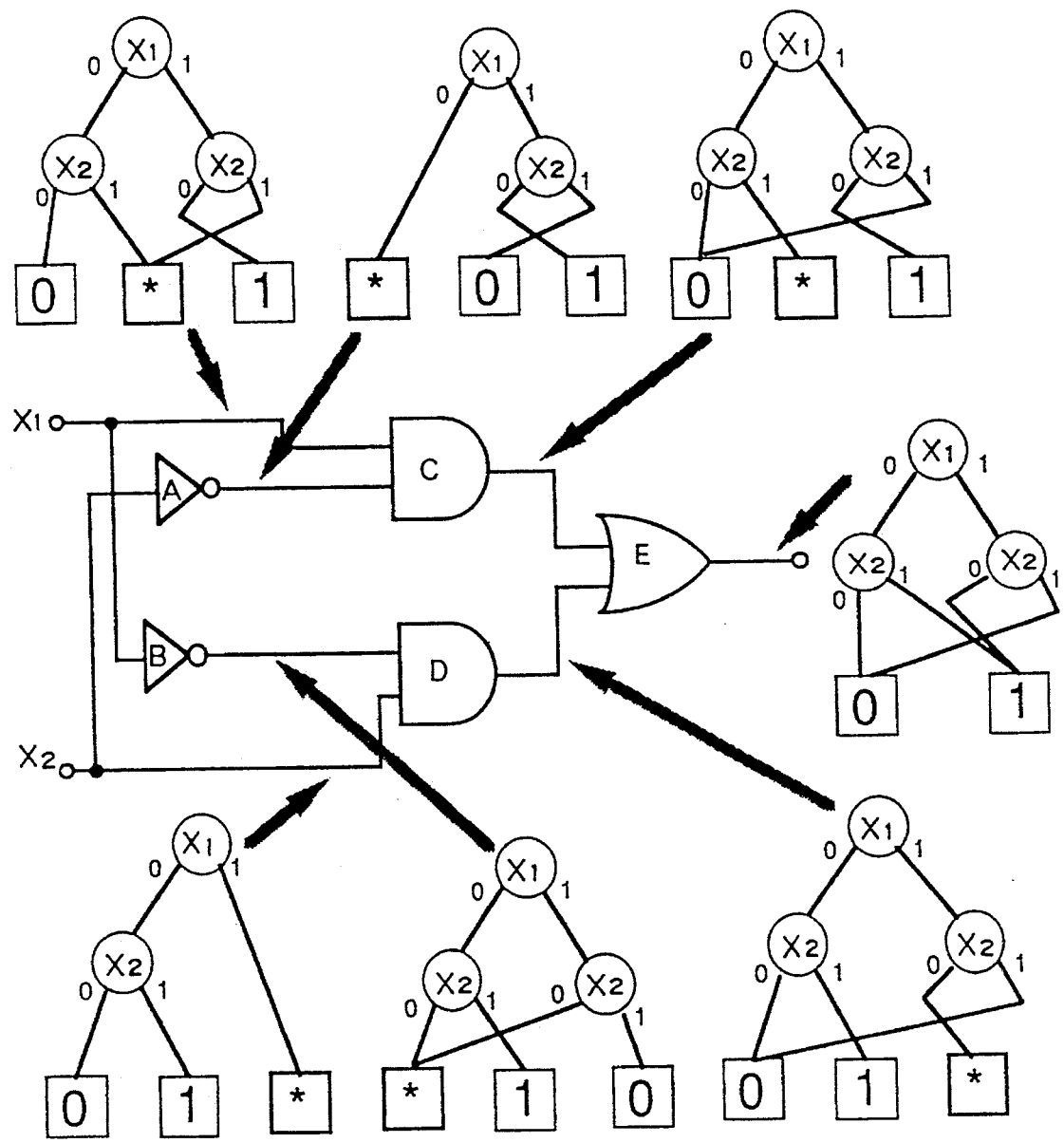
FIG. 9 illustrates examples of binary decision diagrams representing permissible functions of circuits.
Figure 14:
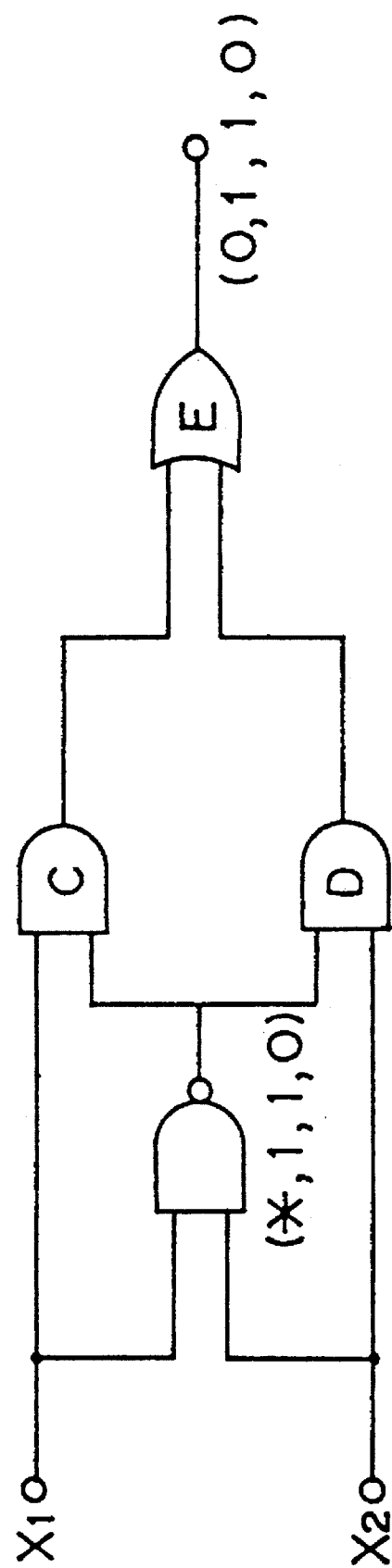
FIG. 14 illustrates a circuit in which a gate A and a gate B are merged.

As a result of the intersection of FIG. 13, the gate corresponding to the merged binary decision diagrams for the gates A and B of FIG. 9 is realized with a NAND gate. FIG. 14 therefore illustrates the permissible function of the gate into which gates A and B are merged.

FIG. 15 illustrates a process of performing an operation on two binary decision diagrams, an OR operation in this embodiment. In such operational processing, each of the two binary decision diagrams is traced from the root in the direction of the same logic of an input variable corresponding to the root or a node on the graphs, and when a leaf is reached on each of the two binary decision diagrams, a logical operation is performed on them. Such processing, beginning with the root, is repeated for each combination of input variables.

Figure 15A:
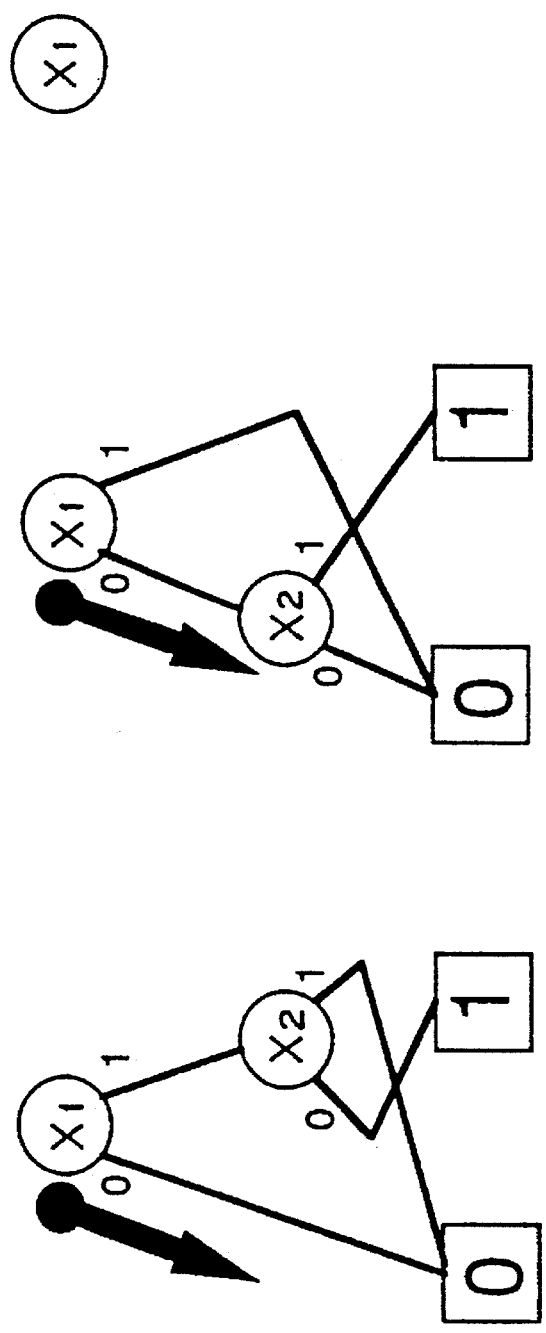

In FIG. 15, operational processing is performed to create the binary decision diagram of gate E which ORs the output of gate C with the output of gate D in FIG. 8. In FIG. 15(a), the binary decision diagrams for gates C and D are each traced from their roots in the case of input variable $X_1=0$. In FIG. 15(b), a leaf representing output logic 0 is reached in the binary decision diagram for gate C. In the binary decision diagram for gate D, a node having a variable $X_2$ is reached and the graph is traced again from the node in the direction of $X_2=0$. In the binary decision diagram for gate D as well, a leaf representing output logic 0 is reached as shown in FIG. 15(c). As a result, the output logic of the leaf reached in the binary decision diagram for gate C is ORed with the output logic of the leaf in the binary decision diagram for gate D. In this case, the ORing of 0 and 0 produces 0. The resultant part of the binary decision diagram for gate E represents that the output logic becomes 0 when input variable $X_1=X_2=0$.

Subsequently, the processing for other logical combinations of input variables $X_1$ and $X_2$ is continued. In FIG. 15(d), the binary diagrams are traced for $X_1=0$ and $X_2=1$. For gate C, the leaf representing output logic 0 is already reached. For gate D the binary decision diagram is traced. As a result, the leaf representing output logic 1 is reached on the binary decision diagram for gate D, as shown in FIG. 15(e).

The logic 0 of the leaf for gate C and the logic 1 of the leaf for gate D are ORed. Thus, the resultant output logic of gate E will be 1.

Next, in FIG. 15(f), the binary decision diagrams for gates C and D are traced from their roots in the direction of $X_1=1$. As shown in FIG. 15(g), the leaf representing output logic 0 is reached on the side of gate D, while the binary decision diagram is traced in the direction of $X_2=0$ on the side of gate C. Consequently, as shown in FIG. 15(h), the leaf representing output logic 1 is reached on the side of gate C as well. The ORing of the two leaves representing 1 and 0 is performed so that the resultant output logic will become 1 on the binary decision diagram for gate E. Next, the binary decision diagrams are traced for $X_1=X_2=1$ as shown in FIGS. 15(i) and 15(j) so that the binary decision diagram for gate E is completed as shown in Figure 15(j).

FIG. 16 illustrates an embodiment of a program for intersection of two binary decision diagrams as shown in FIG. 13, i.e., a gate merge application program. Whether or not two gates g1 and g2 can be merged is examined for all combinations of gates constructing a multistage logic circuit. First, gate g2 is changed to examine whether or not a gate or gates g2 can be merged with a certain gate g1. Next, gate g1 is changed to another one to examine whether or not a gate or gates g2 can be merged with the new gate g1.

The "try merge" is a process for determining whether or not the merge of gates is possible. First, an examination is made as to whether or not there is a common part p5 between permissible functions PF for two gates g1 and g2. If the common set is null, a merge is impossible. If not null, there is the possibility of a merge between gates g1 and g2. If there is the possibility of a merge, an examination is made as to whether or not a gate which can satisfy the conditions can be made and then the process terminates.

FIG. 17 illustrates an embodiment of a program of operational processing of two binary decision diagrams as illustrated in FIG. 15. In the Figure, the operation on binary decision graphs is performed by a process called "apply". In FIG. 17, in the first step of the function "apply_step" the following calculation is performed.

val=v1->val op v2->val;

For example, in the case of an OR operation, ORing is performed instead of the above op. vl-> val refers to values for a node vl which is a general term for the root, nodes and leaves of a binary decision diagram. Terminal nodes (leaves) have values of 0 and 1 (terminal node values), while non-terminal nodes (intermediate nodes) have a value of X. With three such values of 0, 1 and X used as elements, the OR operation is defined such that 0OR=0, 0OR1=1, 0ORX =1, 1OR0=1, 1OR1=1, 1, XOR0=X, XOR1=1 and XORX= X. (This corresponds to the case of a binary decision diagram having two values 0 and 1 as terminal node values. A little more complexity will result in the case of a binary decision diagram having three values, which contain * representing a permissible function, as terminal node's values.) The AND operation and the like will be defined likewise.

Figure 1:
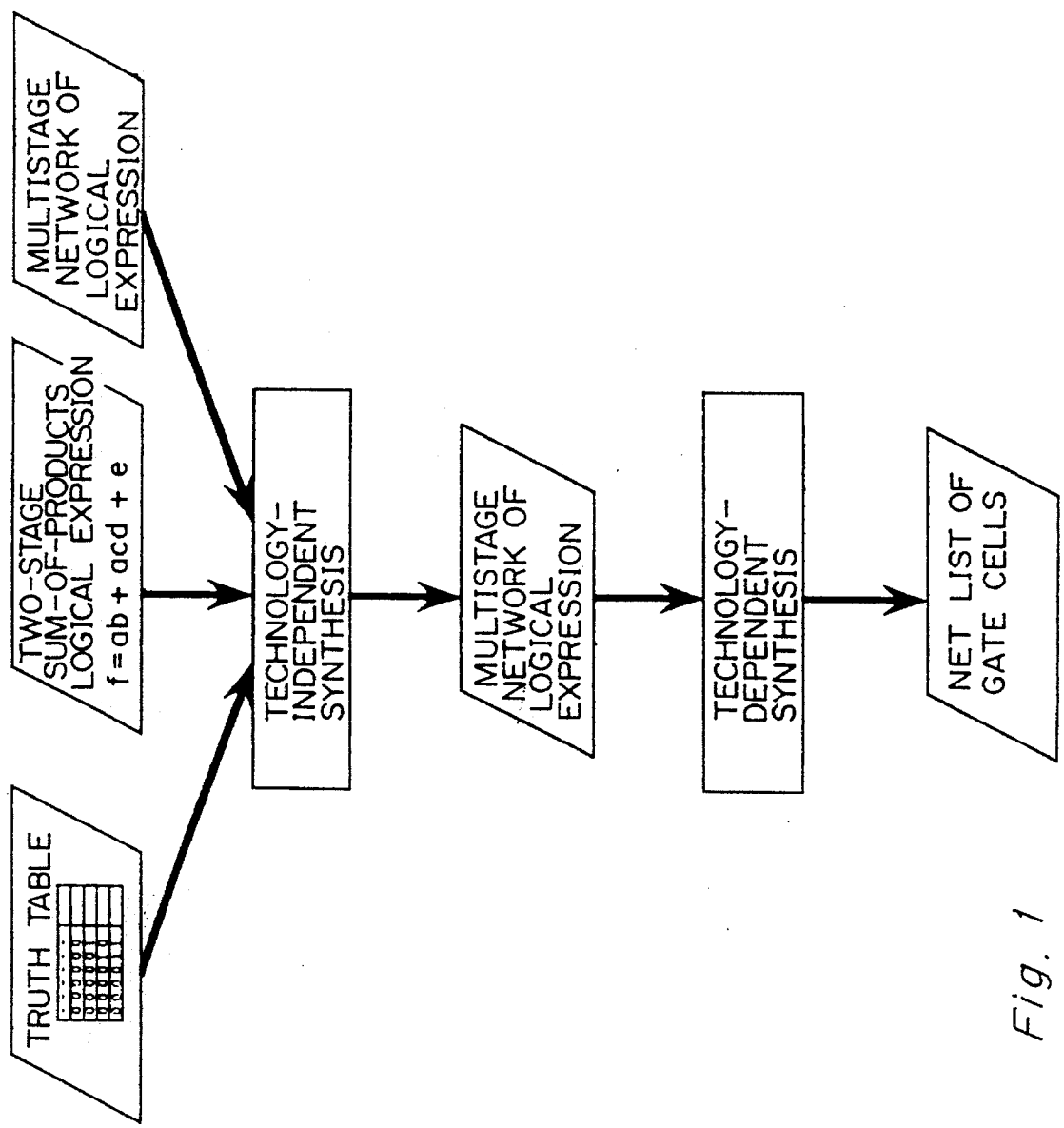
FIG. 1 illustrates an example of a general flow of a logic synthesizing process.
Figure 2:
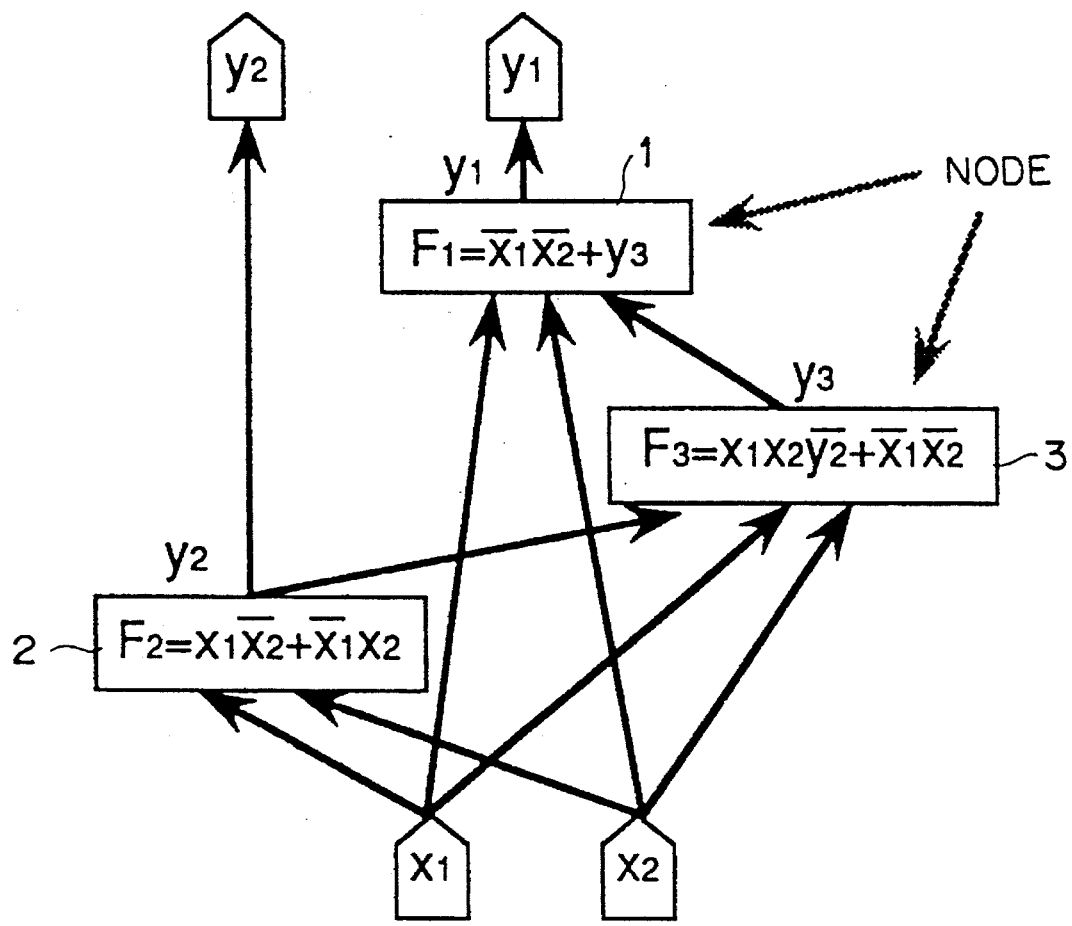
FIG. 2 illustrates an example of a multistage logic network.
Figure 4:
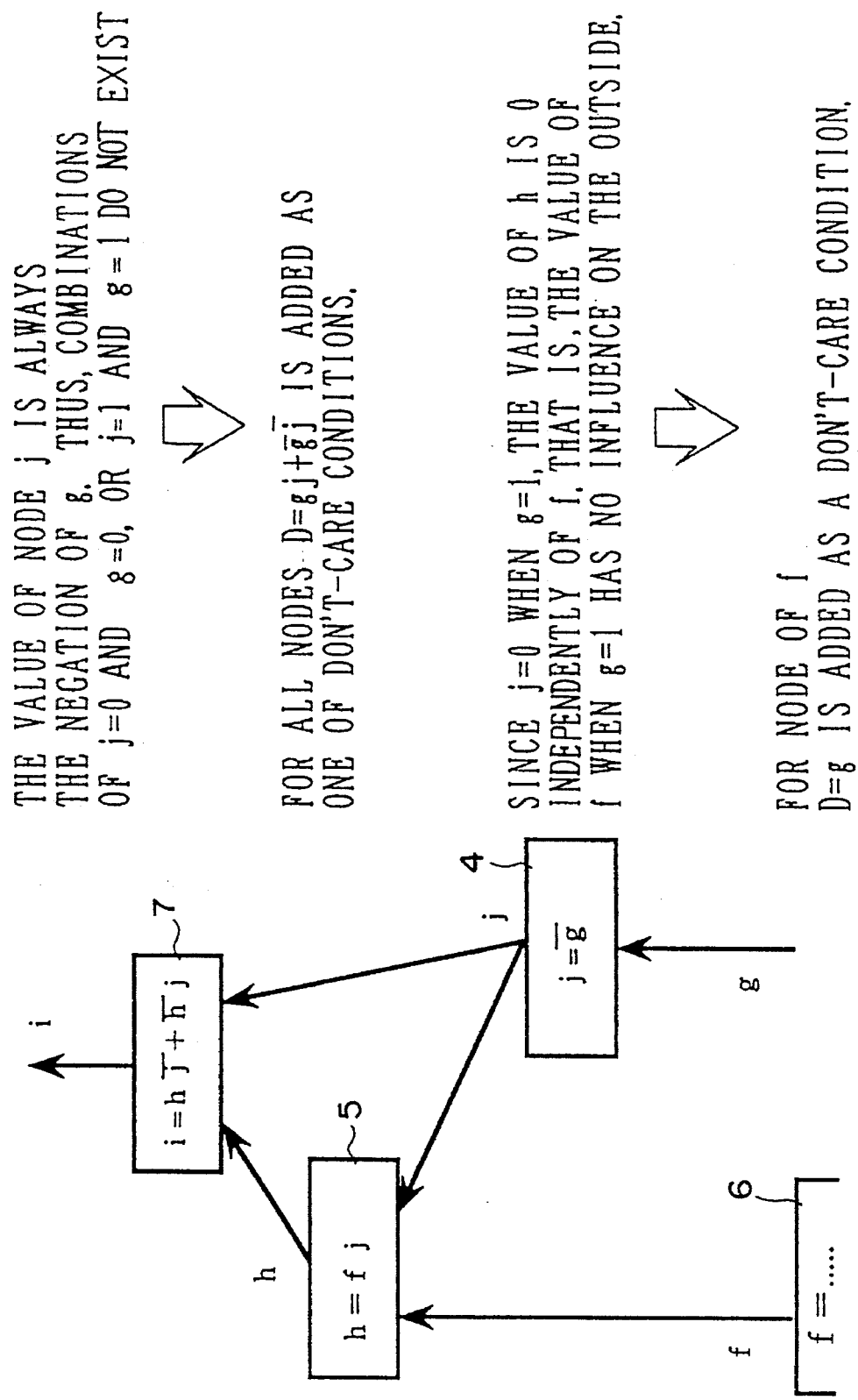
FIG. 4 illustrates an example of a don't-care condition in a multistage network according to method Ar.
Figure 5:
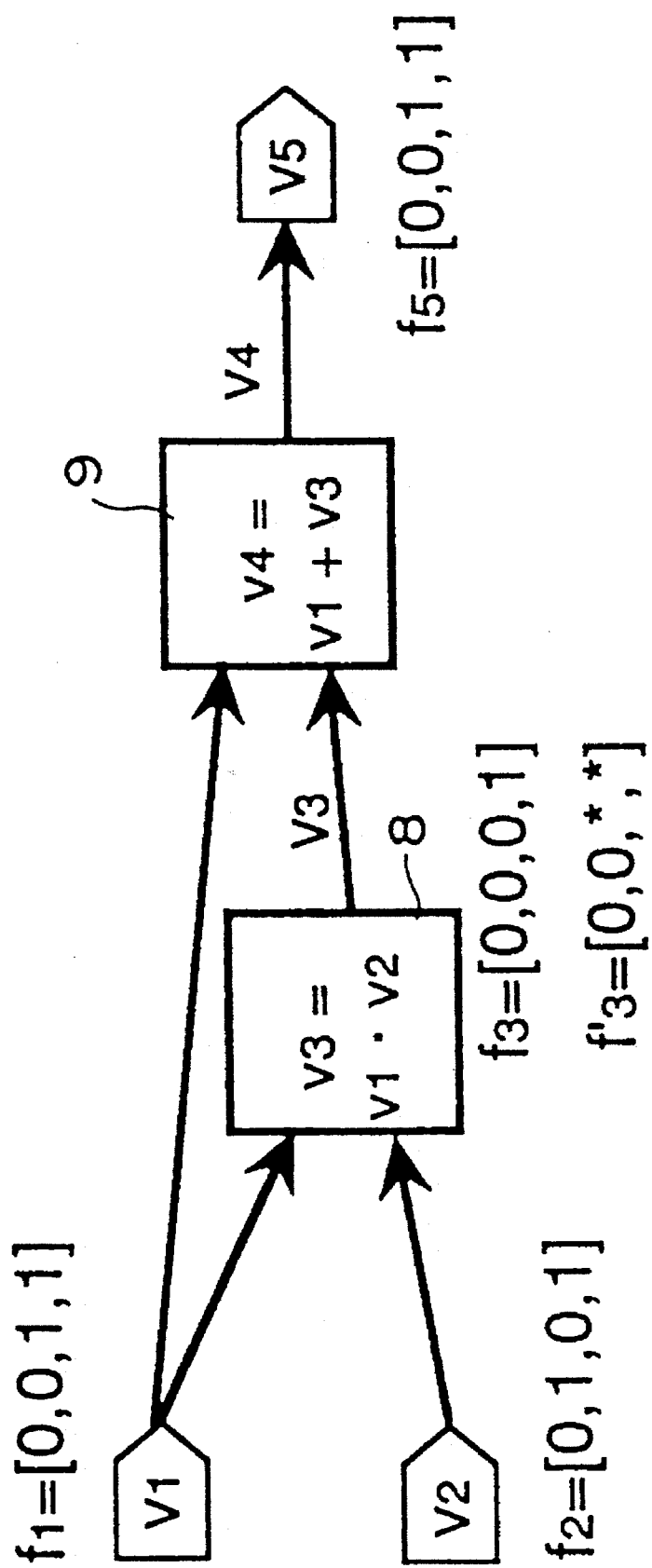
FIG. 5 illustrates an example of a don't-care condition in a multistage network according to method B.
Figure 6A:
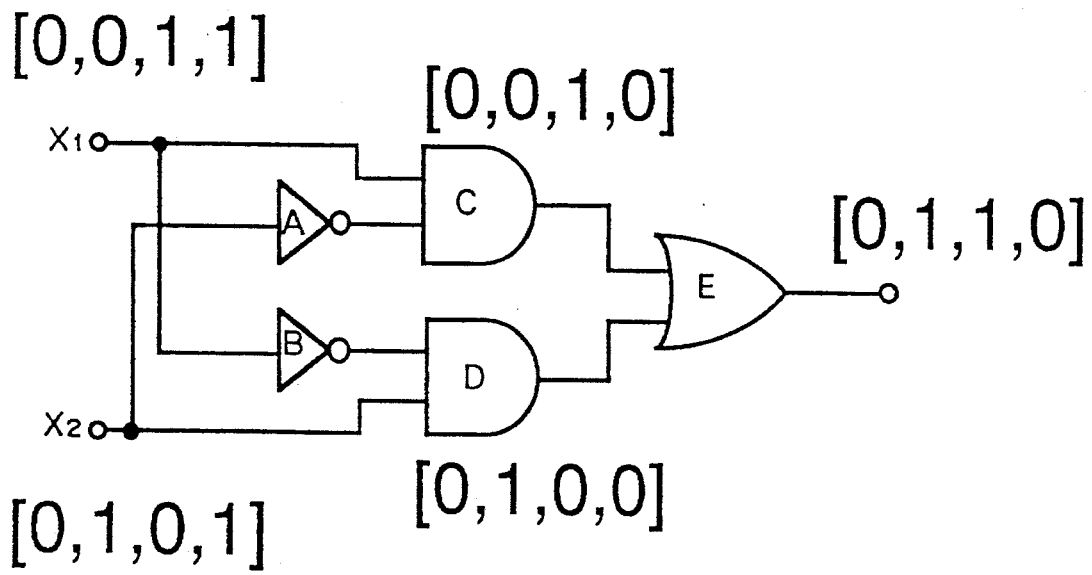
Figure 6B:
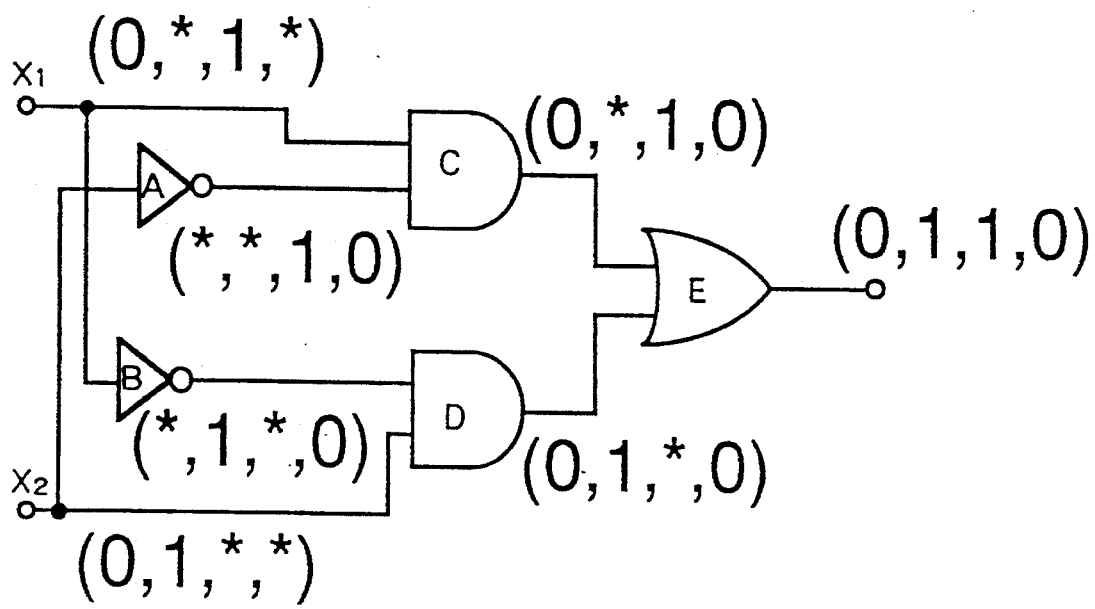
Figure 6C:
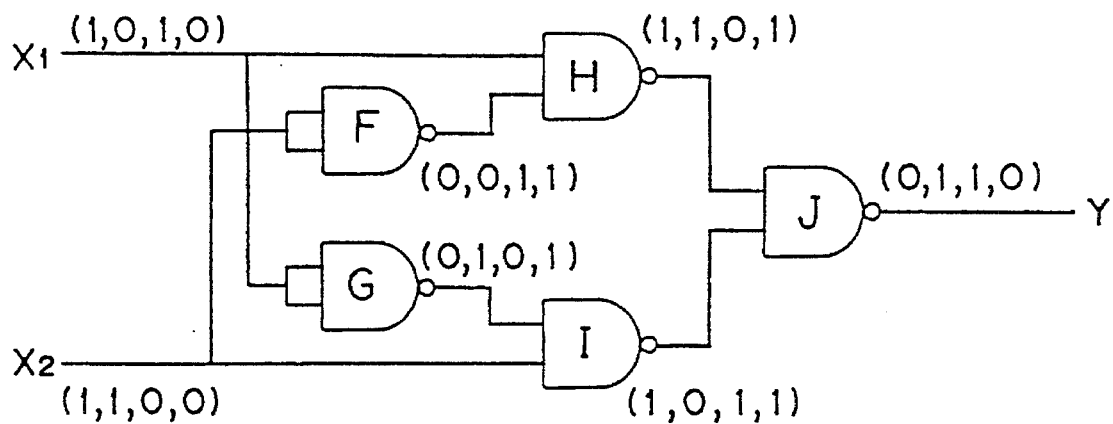
Figure 6D:
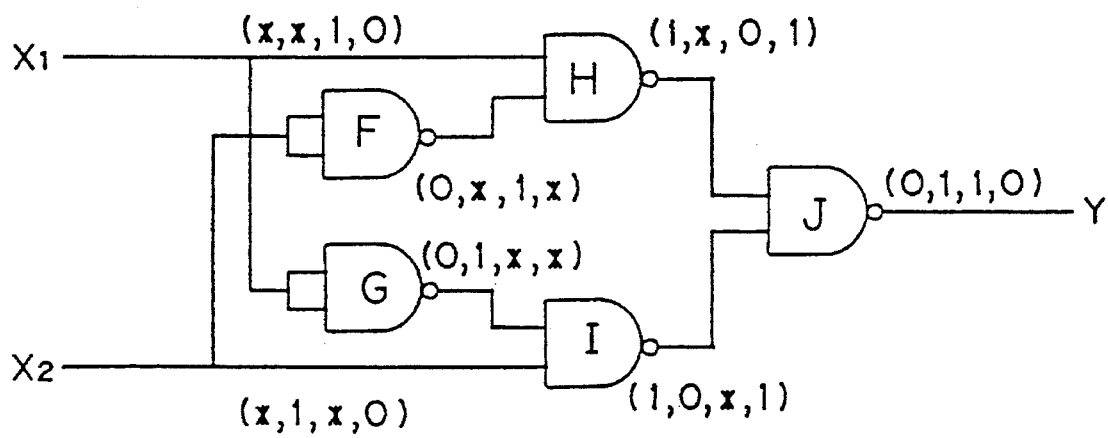
Figure 7A:
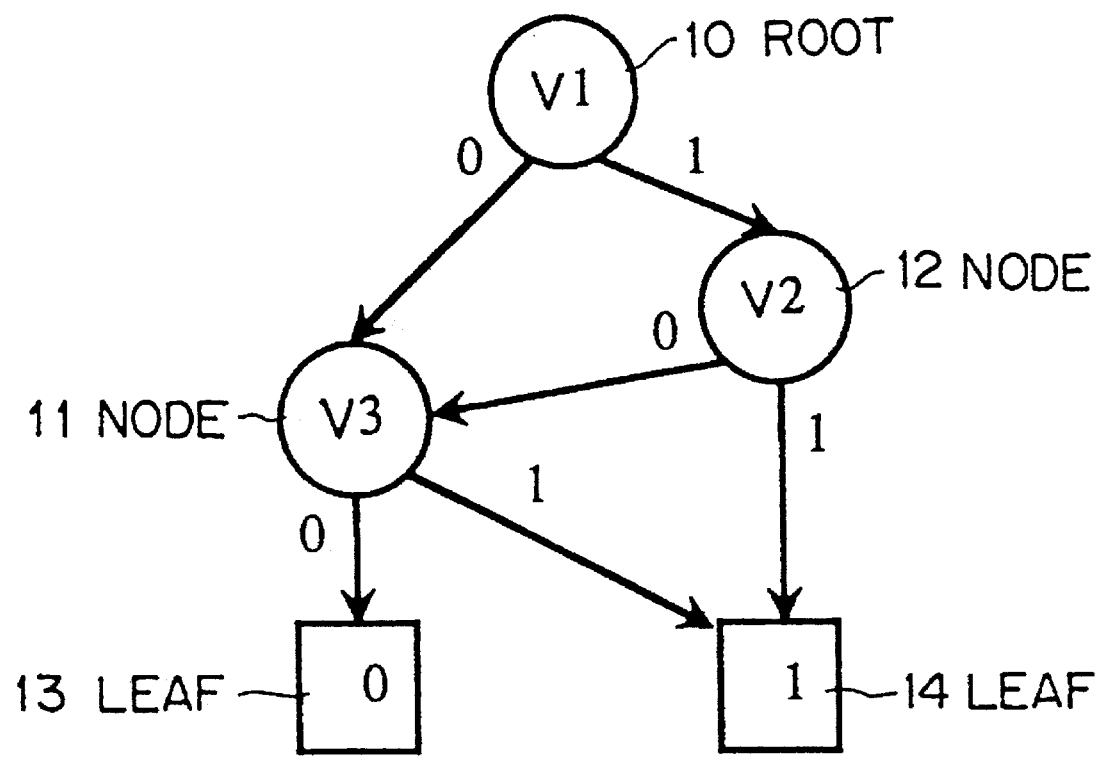
FIGS. 7(a) through 7(e) are diagrams for explaining the principle of the present invention.
Figure 7:
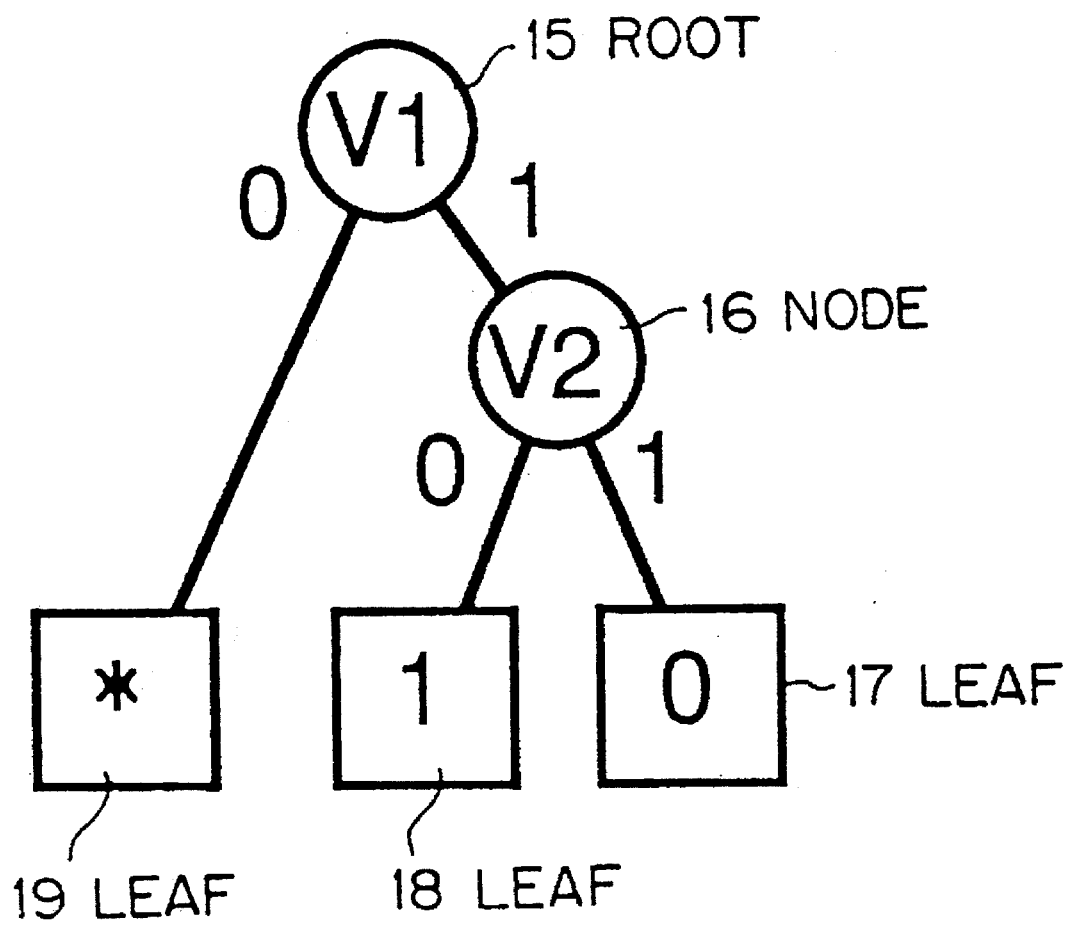

The "index" in FIG. 17 represents the correspondence between each node (root and nodes) and an input variable in a binary decision diagram. For example, in FIG. 7(a), the index of the root 10 is $V_1$ and the index of the node 11 is $V_3$. As illustrated in FIGS. 8 and 9, a plurality of nodes may have the same index.

Figure 18:
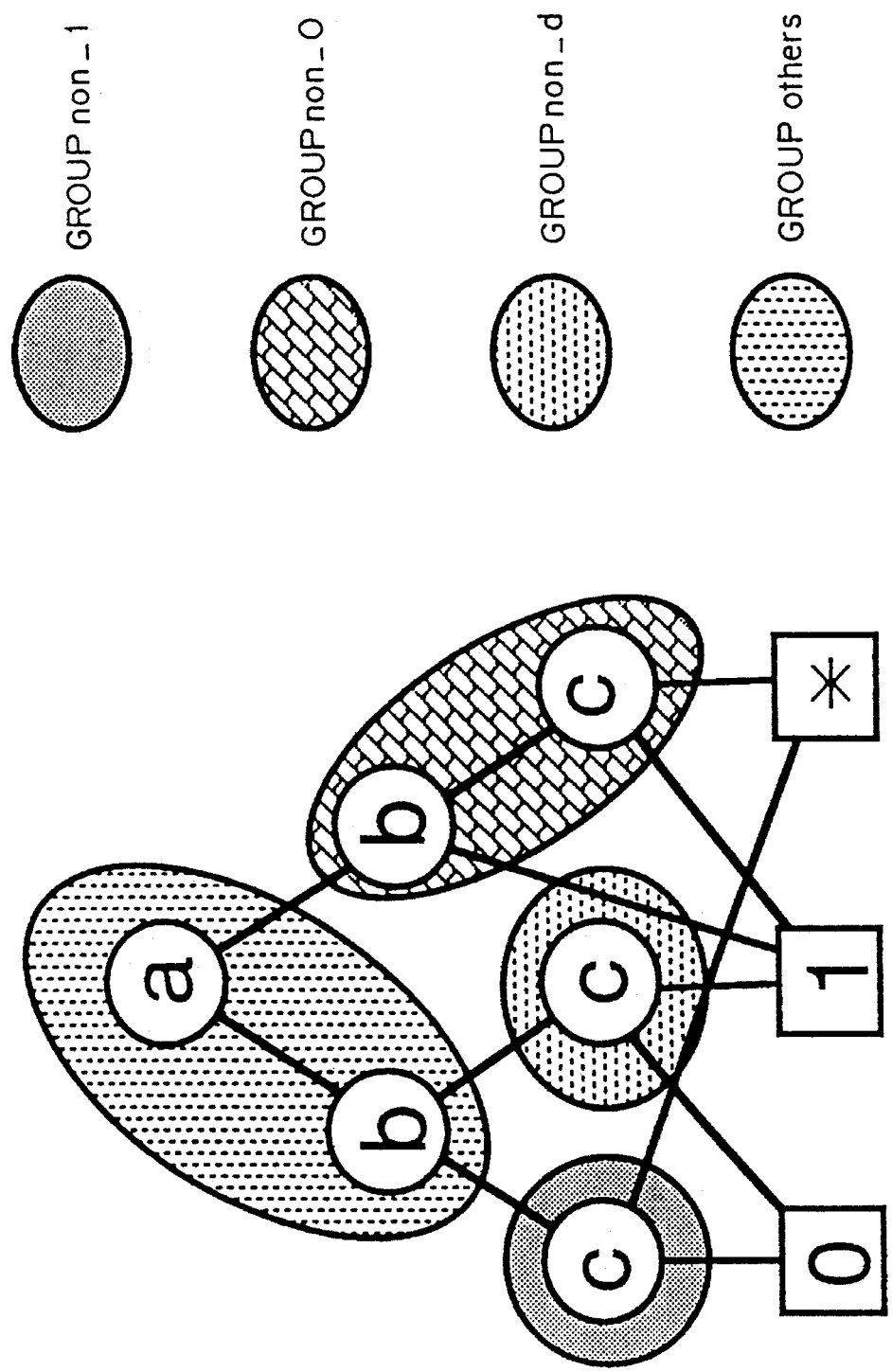
FIG. 18 illustrates an embodiment of classification of non-terminal points in a binary decision diagram.

FIG. 18 illustrates the classification of non-terminal points other than leaves, or the root and nodes in a binary decision diagram representing a permissible function. In the Figure, the non-terminal points are classified into four groups, i.e., group non 1 that is never connected to the leaf of logic 1, group non 0 that is never connected to the leaf of logic 0, group non d that is never connected to the leaf of don't care and group others.

As described in conjunction with FIG. 15, in the operation on two binary decision diagrams, the points are traced so that identical variables may have identical values, and each time the graphs are traced to leaves, the operation is performed using logical values of the leaves. In the case of operation on binary (two-valued) variables, when, for example, the logical product is computed between two binary decision diagrams, the computed result will be found to be 0 when the leaf of output logic 0 is reached on one of the graphs. Thus, a returning process of the result is performed without further tracing the binary decision diagrams.

In the operation on three-valued variables containing a don't-care variable, the operation on two binary decision diagrams will become more complex. When a check is made for the case where a value becomes 0 in certain conditions, if a non-terminal point belonging to the group non 0 is reached when the binary decision diagrams are being traced, then it will be found that the point does not lead to the leaf of output logic 0. At this point the search can be canceled, thus improving the efficiency of operational processing.

FIGS. 19 and 20 illustrate examples of a process of transforming binary decision diagrams. FIG. 19(a) is an original binary decision diagram in which nodes 40 and 42, having an input variable of $X_2$ of the last order, point to the leaf 42 representing output logic 0 when $X_2=1$ and to the leaf 43 representing output logic 1 when $X_2=0$. Thus, these nodes can be merged into one node 45 as shown in FIG. 19(b). Furthermore, in FIG. 19(b), the root 44 points to the node 45 regardless of whether the input variable $X_1$ of the highest order takes either 0 or 1. Thus, the input variable $X_1$ of the highest order is removed herein for transformation into a binary decision diagram shown in FIG. 19(c).

Figure 20A:
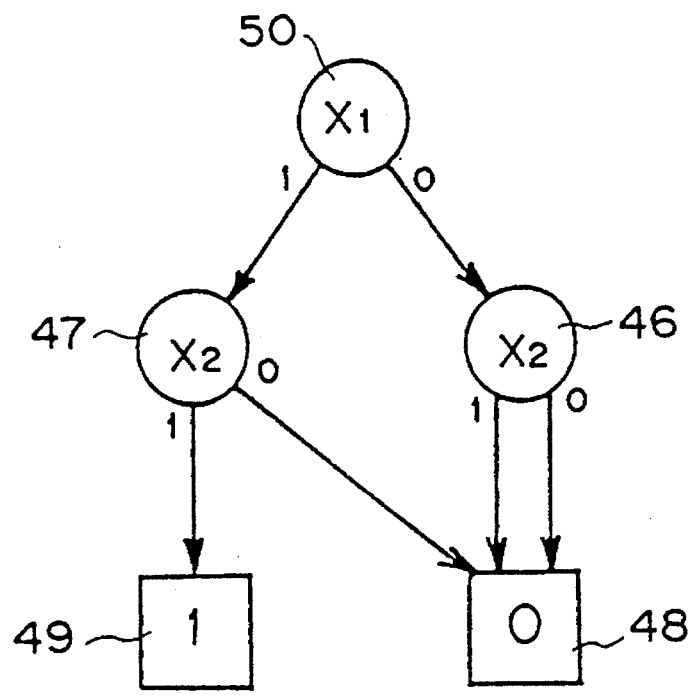
Figure 20B:
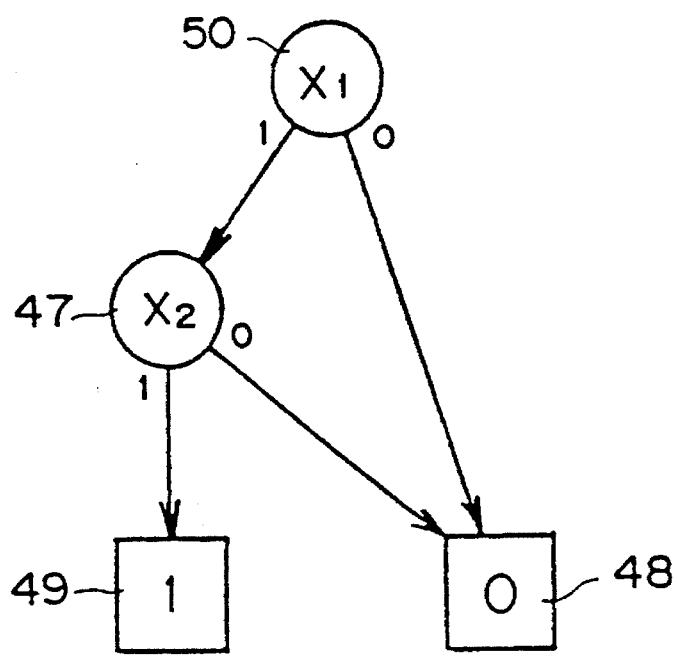

FIGS. 20(a) and 20(b) are binary decision diagrams for a two-input AND circuit. In the original binary decision diagram of FIG. 20(a), a node 46 points to the same leaf 48 in both cases of its input variable $X_2=0$ and $X_2=1$. For this reason, the input variable to the node can be removed as shown in FIG. 20(b).

FIGS. 20(c) to 20(f) illustrate a binary decision diagram representing a logic function of a three-input circuit for providing an output of $$X_1 \cdot (X_2 \cdot X_3 + X_2 \cdot X_3) + X_1 \cdot (X_2 \cdot X_3 + X_2 \cdot X_3)$$

and its conversion process. In the original graph of FIG. 20(c), nodes 54 and 56, having a variable $X_3$, both point to a leaf 58 when $X_3$ is 0 or the other leaf 59 when $X_3$ is 1. Likewise, nodes 55 and 57, having the variable $X_3$, point to leaf 58 when $X_3$ is 1 or leaf 59 when $X_3$ is 0. Thus, nodes 54 and 56 are merged into a node 60 and the nodes 55 and 57 are merged into a node 61 as shown in FIG. 20(d). In FIG. 20(d), nodes 52 and 53 having an input variable $X_2$ point to node 60 when $X_2$ is 1 or to node 61 when $X_2$ is 0. Thus, these nodes 52 and 53 are merged into a node 62 as shown in FIG. 20(e). Furthermore, in FIG. 20(e), the root 51 having an input variable $X_1$ points to the node 62 in both cases of $X_1=1$ and $X_1=0$. Therefore, the root 51 can be removed and finally the graph of FIG. 20(f) will be obtained.

Figure 21:
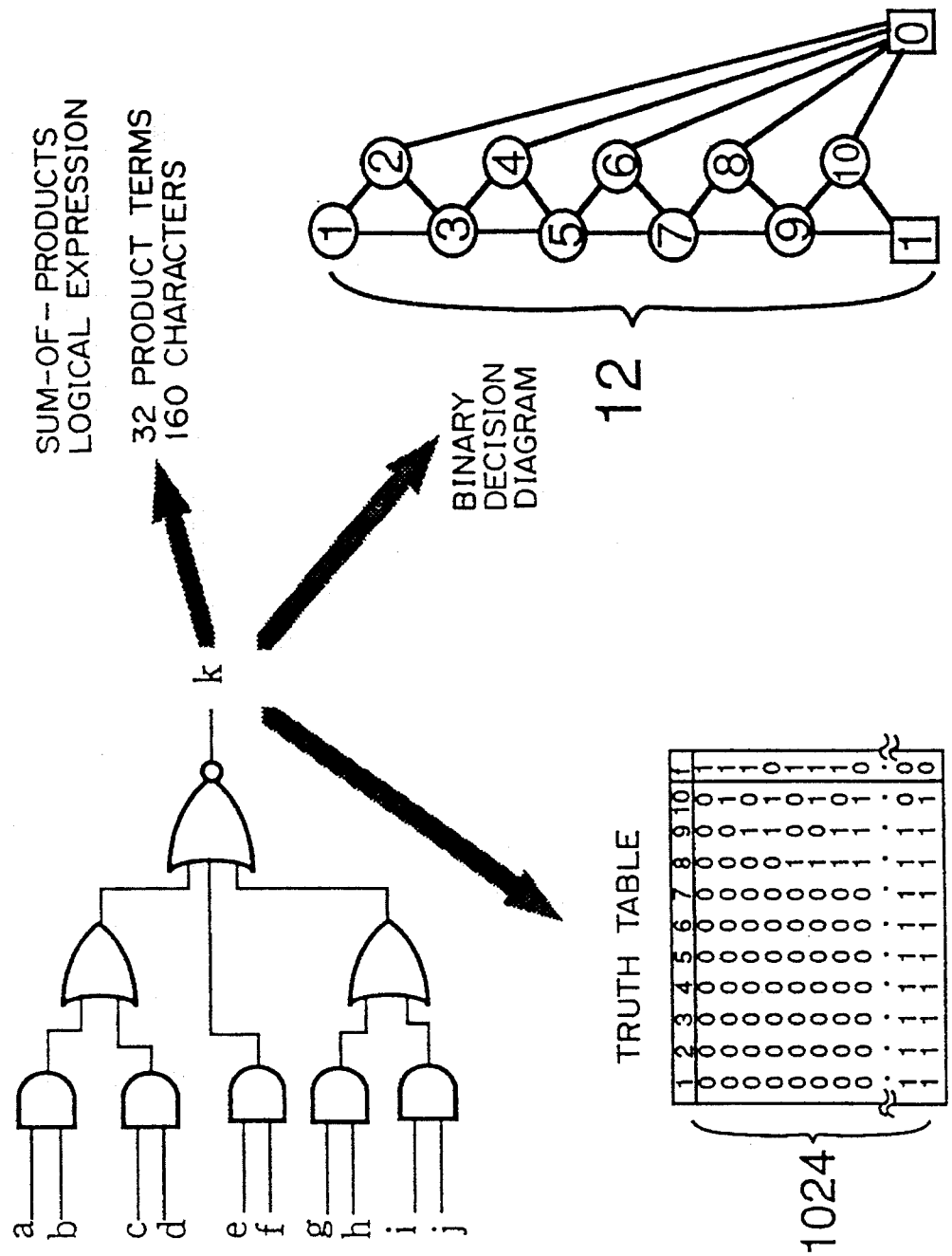
FIG. 21 is an illustration of the output logic of a circuit in the form of a truth table, a sum-of-products logic expression and a binary decision diagram.
Figure 22:
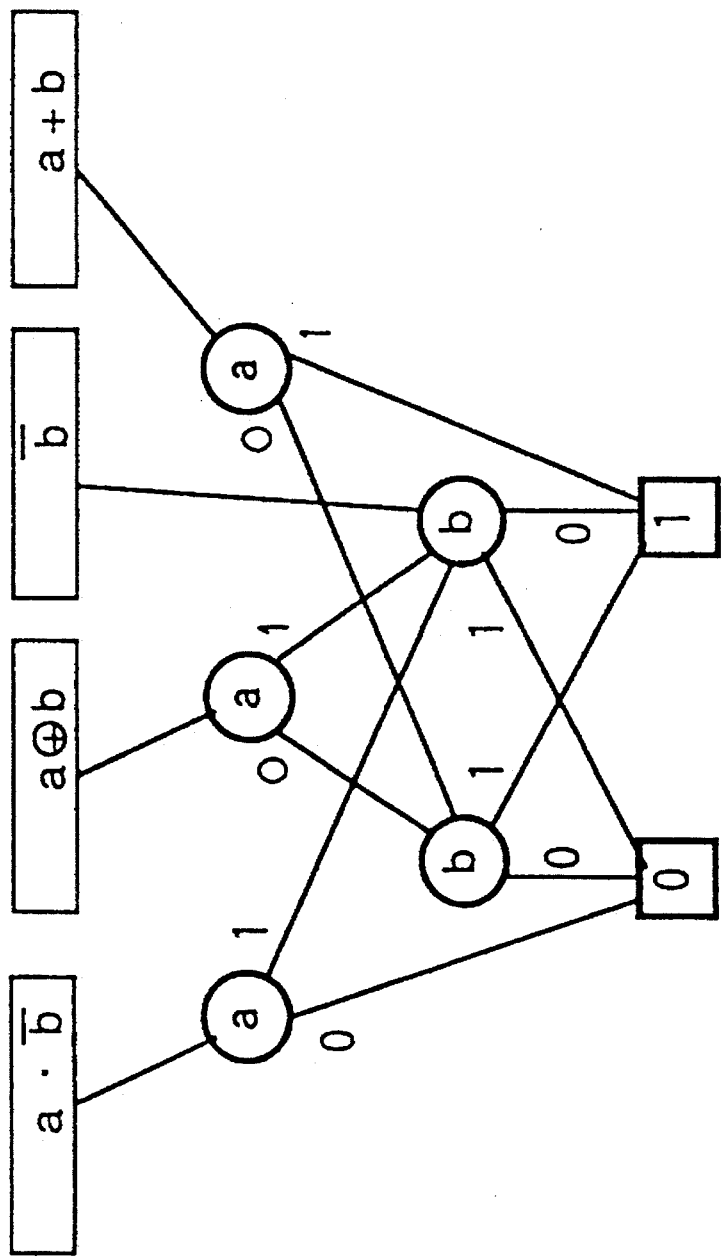
FIG. 22 illustrates an example of a shared binary decision diagram representing a plurality of logic functions.

FIG. 21 illustrates an example of representation of the output logic of a circuit in terms of a truth table, a sum-of-products logical expression and a binary decision diagram. The truth table always requires $2^n$ rows (n being the number of inputs) and the two-stage sum-of-products logical expression requires 32 product terms. The negation (=ab+cd+ef+ gh+ij) of the logic can be expressed by use of five product terms, i.e., ten characters. However, the affirmation of the logic will not be expressed compactly.

The expansion of (a+b) (c+d) (e+f) (g+h) (i+j) will result in 32 product terms, i.e., 160 characters. In a multistage network, the affirmative logic and the negative logic of the same node are frequently utilized. It is a serious drawback that a two-stage sum-of-products logical expression has no symmetric property for affirmative and negative expressions. In the case of a binary decision diagram, this example of logic can be expressed with ten non-terminal points and two terminal points. The negation of the logic can also be expressed with the same number of graphs (1 and 0 are merely interchanged).

The Possibility of Utilizing the Invention in the Industrial View

According to the present invention, as described above, not only a single logic function can be expressed compactly, but also many logic functions can be expressed efficiently by sharing parts of the same form in partial graphs between binary decision diagrams representing a plurality of logic functions. This feature is very useful in reducing the amount of memory in optimizing a multistage logic circuit, in which case a logic function and don't-care conditions need to be retained for each node. This is impossible to realize with expressions by a truth table and a sum-of-products logical expression. The logic-circuit expressing method according to the present invention is used to optimize a multistage logic circuit and is useful for automatic synthesis of multistage logic circuits using a computer.

What is claimed is:

1. A computer-implemented method for optimizing a logic circuit in a multistage logic circuit optimizing process system for performing removal or scale-down modification of redundant circuit parts without changing the output logic of the circuit, said method comprising the steps of:

(a) determining, by a computer, the order of a plurality of input variables of the multistage logic circuit;

(b) creating a binary decision diagram representing a logic function for each gate and net of the multistage logic circuit, the binary decision diagram containing (1,0) as output logic;

(c) creating a binary decision diagram representing a permissible function of a tree structure in which branches are linked to leaves for providing output logic (1, 0, don't care) for each gate and net of the multistage logic circuit;

(d) performing an optimizing process involving removal of redundant parts of the multistage logic circuit and merge gates using the binary decision diagram representing the logic function and the binary decision diagram representing the permissible function;

(e) determining whether or not a change has been made in the multistage logic circuit as a result of the optimizing process; and (f) repeating the above steps (a)–(e) when a change is made and terminating the processing when no change is made in the multistage logic circuit.

2. A method according to claim 1, further comprising the steps of:

(g) creating a binary decision diagram representing a logic function for each input variable of the multistage logic circuit;

(h) choosing from gates forming the multistage logic circuit one gate in which all the logics of fan-ins are calculated;

(i) creating a binary decision diagram representing a logic function of the output of the gate chosen in said step (h);

(j) determining whether or not there is an uncalculated gate; and (k) repeating the above steps (h)–(j) and terminating the processing when there is no uncalculated gate.

3. A method according to claim 1, further comprising the steps of:

(g) creating a binary decision diagram representing a permissible function of the output variable of the multistage logic circuit;

(h) choosing a gate whose output permissible function has been calculated;

(i) creating binary decision diagrams representing permissible functions of nets which are fan-ins of the chosen gate;

(j) creating binary decision diagrams representing permissible functions for outputs of gates providing inputs to the nets from the created binary decision diagrams representing permissible functions of the nets;

(k) determining whether or not there is an uncalculated gate; and (l) repeating the above steps (h)–(k) when there is an uncalculated gate and terminating the processing when there is no uncalculated gate.

4. A method according to claim 1, further comprising the step of:

(g) taking the intersection between binary decision diagrams representing permissible functions of outputs of two gates to terminate a branch of a logical combination of input variables that is linked with a leaf of don't care to a leaf of logic 0 or 1, thereby creating a binary decision diagram representing a permissible function for a gate into which the two gates are merged.

5. A method according to claim 1, further comprising the steps of:

(g) tracing two binary decision diagrams from their respective roots in the same direction as a logic signal of an input variable corresponding to the root and a node for operational processing between two binary decision diagrams representing permissible functions or two binary decision diagrams representing logical functions for outputs of two gates forming the multistage logic circuit; and (h) processing from the roots of the two binary decision diagrams is repeated for each combination of logical states of input variables.

6. A method according to claim 1, further comprising the step of:

(g) classifying roots and nodes other than leaves of the binary decision diagram representing the permissible function into four non-terminal point groups including a group non 1 which is never linked with a leaf of logic 1, a group non 0 which is never linked with a leaf of logic 0, a group non d which is never linked with a leaf of don't care and other groups, thereby speeding up operational processing between two binary decision diagrams.

7. A method according to claim 1, further comprising the step of:

(g) transforming the binary decision diagram representing a permissible function or the binary decision diagram representing a logic function into a binary decision diagram in which, of a plurality of nodes having an input variable of the last order, nodes that point to a leaf of the same output logic (1, 0) according to the logic (1, 0) of the input variable are merged into a node.

8. A method according to claim 1, further comprising the step of:

(g) transforming, in the binary decision diagram, representing a permissible function or a logic function, when the root or a node that has an input variable of high order points to the same node or leaf of an input variable of low order for either of logic states (1,0) of the input variable, into a binary decision diagram in which either a high order input variable or a low order input variable is removed.

* * * * *

UNITED STATES PATENT AND TRADEMARK OFFICE
CERTIFICATE OF CORRECTION

PATENT NO. : 5,461,574
DATED : October 24, 1995
INVENTOR(S) : Yusuke MATSUNAGA et al.

It is certified that error appears in the above-indentified patent and that said Letters Patent is hereby corrected as shown below:

Title Page [56] References Cited, second column, last reference, line 14, "Gues" should be --Geus--.

Col. 1, line 36, "Synthesizing" should be --synthesizing--;
line 46, "small.)." should be --small).--.

Col. 2, line 11, "a+a=2a a$^2$" should be --a+a=2a and aa=a$^2$.--.

Col. 3, line 20, "care" should be --care.--.

Col. 5, line 38, "Ar," should be --A,--.

Signed and Sealed this

Twenty-third Day of January, 1996

Attest:

BRUCE LEHMAN

*Attesting Officer*          *Commissioner of Patents and Trademarks*